United States Patent [19]

Frailing et al.

[11] 4,322,685
[45] Mar. 30, 1982

[54] AUTOMATIC BATTERY ANALYZER INCLUDING APPARATUS FOR DETERMINING PRESENCE OF SINGLE BAD CELL

[75] Inventors: Charles E. Frailing, Milwaukee; Thomas J. Dougherty, Waukesha; Richard T. Johnson, Hubertus, all of Wis.

[73] Assignee: Globe-Union Inc., Milwaukee, Wis.

[21] Appl. No.: 126,165

[22] Filed: Feb. 29, 1980

[51] Int. Cl.³ .............................................. G01N 27/42
[52] U.S. Cl. .................................... 324/429; 324/427
[58] Field of Search ................... 324/426, 429, 433; 320/48

[56] References Cited

U.S. PATENT DOCUMENTS 3,899,732  8/1975  Staby .................................. 324/429
4,193,025  3/1980  Frailing .............................. 324/427

*Primary Examiner*—Michael J. Tokar
*Attorney, Agent, or Firm*—Neuman, Williams, Anderson & Olson

[57] ABSTRACT

There are described apparatus for detecting the presence of a defective cell in a lead-acid storage battery. The apparatus is included as a part of a larger apparatus for analyzing the condition of the battery and its suitability for further use in automobile lighting, starting, and ignition applications. The apparatus measures the terminal potential of the battery when it is subject to a constant resistance load. If that potential is found to increase more than a predetermined amount during a time interval following the application of the load, the battery is known to have at least one defective cell.

50 Claims, 15 Drawing Figures

AUTOMATIC BATTERY ANALYZER INCLUDING APPARATUS FOR DETERMINING PRESENCE OF SINGLE BAD CELL

BACKGROUND OF THE INVENTION

This invention relates to apparatus for detecting the presence of a single defective cell in a multi-cell storage battery of the type normally used in automotive applications and to apparatus for automatically analyzing such a battery and including apparatus for detecting the presence of a single defective cell.

There has in the past been much effort at developing apparatus for determining the condition of lead-acid storage batteries of the type normally used for starting, lighting, and ignition in the automotive field and, in particular, for determining the acceptability of such batteries for use under adverse conditions such as the starting of an automobile engine at low temperatures. It is desirable that such apparatus be as simple as possible to use and involve the exercise of a minimum amount of judgment by the operator so that it may be operated by personnel with a relatively low level of skill or experience. It is further important that such apparatus be as accurate as possible; in applications where the apparatus is used to determine the acceptability of a battery already in service to a consumer, the same apparatus is likely to be used with batteries which are both in and out of applicable warranty provisions. It is also important that the period of time required to analyze a battery not be unreasonably long and it is further desirable that the analysis be performed without first requiring the time consuming step of recharging the battery on batteries in as wide a variety of different conditions as possible.

Apparatus for automatically analyzing the condition of automotive batteries are known in the prior art. Such apparatus and various of the desideratum relevant thereto are disclosed in the U.S. patent application of C. E. Frailing and T. J. Dougherty, Ser. No. 863,925, filed Dec. 23, 1977, entitled "Automatic Battery Analyzer" and assigned to the assignee of this application, now U.S. Pat. No. 4,193,025 which issued on Mar. 11, 1980. The disclosure of that application is hereby incorporated by reference. While the apparatus shown therein represented a significant improvement over what had been known theretofore, it has now been found that further improvements on such apparatus can be made. In particular, it was found that apparatus constructed in accord with the referenced patent application can to an inconclusive result when a battery was first tested in an undesirably high percentage of cases requiring that the battery be put through a time consuming recharging operation and then tested again. Further, it was found that the accuracy of battery analyzers could be increased over that attained with apparatus constructed in accord with the referenced patent application.

SUMMARY OF THE INVENTION

Thus, it is an object of this invention to provide apparatus for detecting the presence of a single defective cell in a multi-cell storage battery.

It is an object of this invention to provide apparatus for detecting the presence of a single defective cell in a lead-acid, multi-cell storage battery of the type commonly used for lighting, starting, and ignition in the automotive field.

It is an object of this invention to provide apparatus for automatically determining the acceptability of lead-acid, multi-cell storage batteries of the type commonly used for lighting, starting, and ignition in the automotive filed and including apparatus for detecting the presence of a single defective cell in the battery under test.

It is an object of this invention to provide apparatus for automatically determining the acceptability of lead-acid, multi-cell storage batteries which are useful for determining the acceptability of batteries over wider ranges of different battery conditions without the need of recharging the battery than have been obtained with prior automatic battery analyzing apparatus.

It is an object of this invention to provide apparatus for automatically determining the acceptability of lead-acid, multi-cell storage batteries which do not require an unnecessarily prolonged period of time to make the desired determination.

It is an object of this invention to provide apparatus for automatically determining the acceptability of multi-cell storage batteries which meet the aforementioned objects and are further characterized by simplicity of design, ease of operation, and economy of construction.

Further and additional objects of this invention will be apparent from this description, the drawing, and the appended claims.

DESCRIPTION OF THE PREFERRED EMBODIMENT

Figure 1:
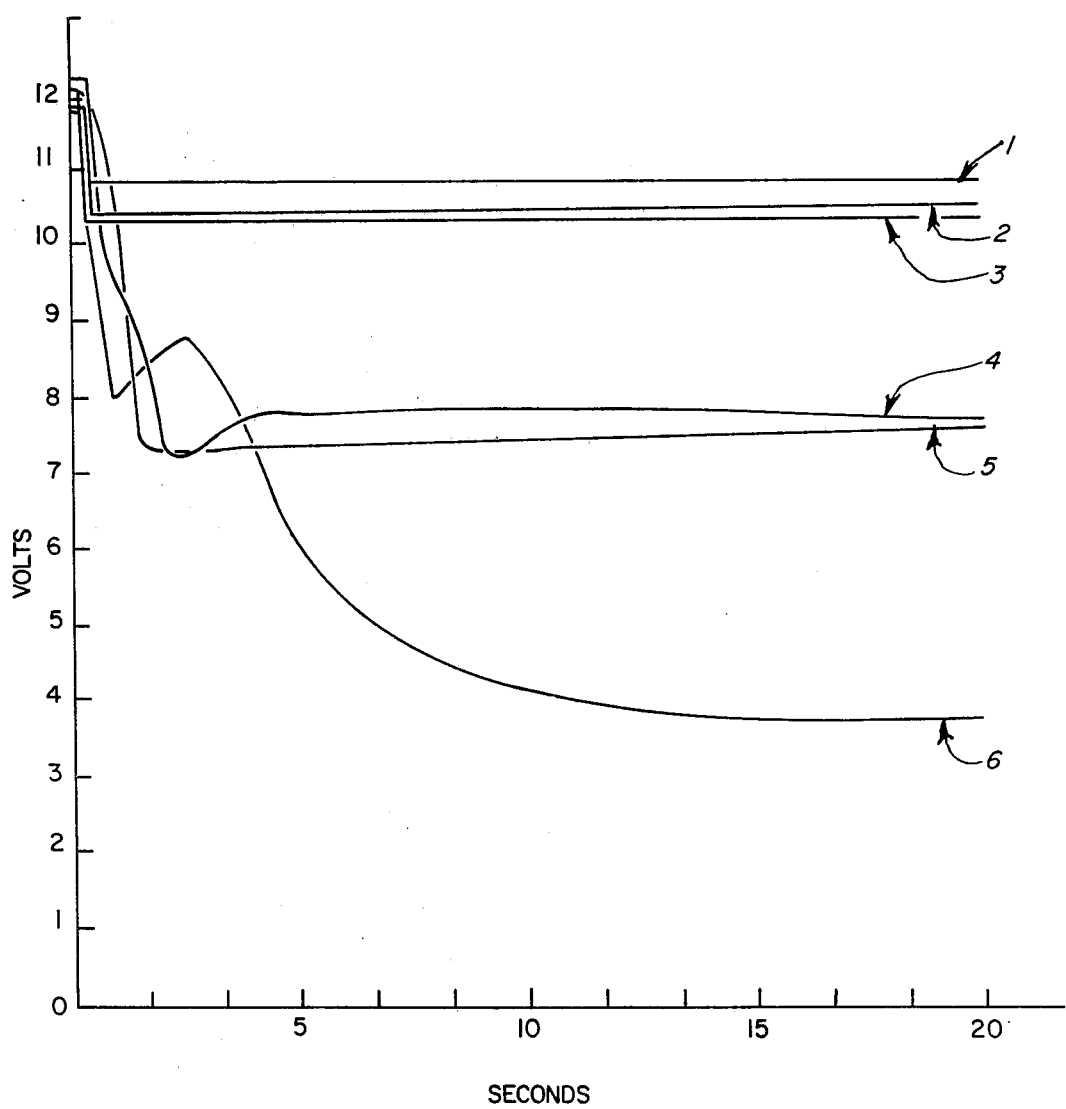
FIGS. 1 and 2 are graphs useful for explaining the operation of the preferred embodiment of this invention.

There is disclosed in the drawings an automatic battery analyzer including the preferred embodiment of this invention and intended for analyzing 6 cell, 12 volt batteries of the lead-acid type normally used for automative lighting, starting, and ignition applications. As will be explained in greater detail hereinafter, the disclosed battery analyzer performs essentially four separate tests on the battery being tested in a prescribed order:

1. The open circuit voltage of the battery is measured, and if less than 10.80 volts the battery is determined to be unacceptable. This test primarily rejects batteries which have one or more severly shorted cells, leaks between one or more cells, or an open electrical circuit in the battery (usually at one of the welds connecting the cells together).

2. A load test is performed under which the battery is placed under a sufficient load to deliver a current equal to approximately one-half its cold current cranking rating for a period of twenty seconds. If the battery terminal voltage does not fail below a predetermined value, which value is corrected in accord with the temperature of the battery being tested, during that twenty second period, the battery is assumed to have passed the load test and to be acceptable and no further tests are performed on it.

3. A voltage bounce back test is performed by which the battery open circuit voltage is measured at the end of a fifteen second period following the completion of the load test. If the battery terminal voltage at the end of that period exceeds a predetermined value, which value is also corrected in accord with the temperature of the battery being tested, the battery is assumed to have passed the voltage bounce back test indicating that it is unacceptable and no further tests are performed on it.

4. A constant resistance load test is performed under which the battery is loaded with a fixed resistance and the variation of the battery terminal voltage with time over a given period is analyzed to determine the presence of a defective cell in the battery. In the embodiment disclosed, a 0.1 ohm. resistive load is placed across the battery for twenty seconds, and the battery terminal voltage is measured at the ends of each of the fifth through the twentieth seconds. These separate determinations are then made. (a) If the measured battery terminal voltage should increase by 0.17 volts or more during the sixth through the fifteenth seconds of that time period, the battery is assumed to have at least one defective cell and to be unacceptable. (b) If the battery is not yet determined to be unacceptable at the end of the fifteenth second, its terminal voltage is compared to a temperature corrected, standard battery voltage at the end of the fifteenth second and if the terminal voltage exceeds that standard, the battery is assumed to be acceptable and merely in need of being recharged. (c) If the acceptability of the battery is still not determined at the end of the fifteenth second, then if the battery terminal voltage should rise by 0.17 volts or more during the sixteenth through the twentieth second, the battery is assumed to be unacceptable; if the battery is not thus determined to be unacceptable, it is assumed that the condition of the battery is essentially indeterminate and the battery must be recharged to a fully charged condition and retested. (In the case of a battery known to be fully charged, only the open circuit voltage and load tests of items 1 and 2 above are performed.

Figure 2:
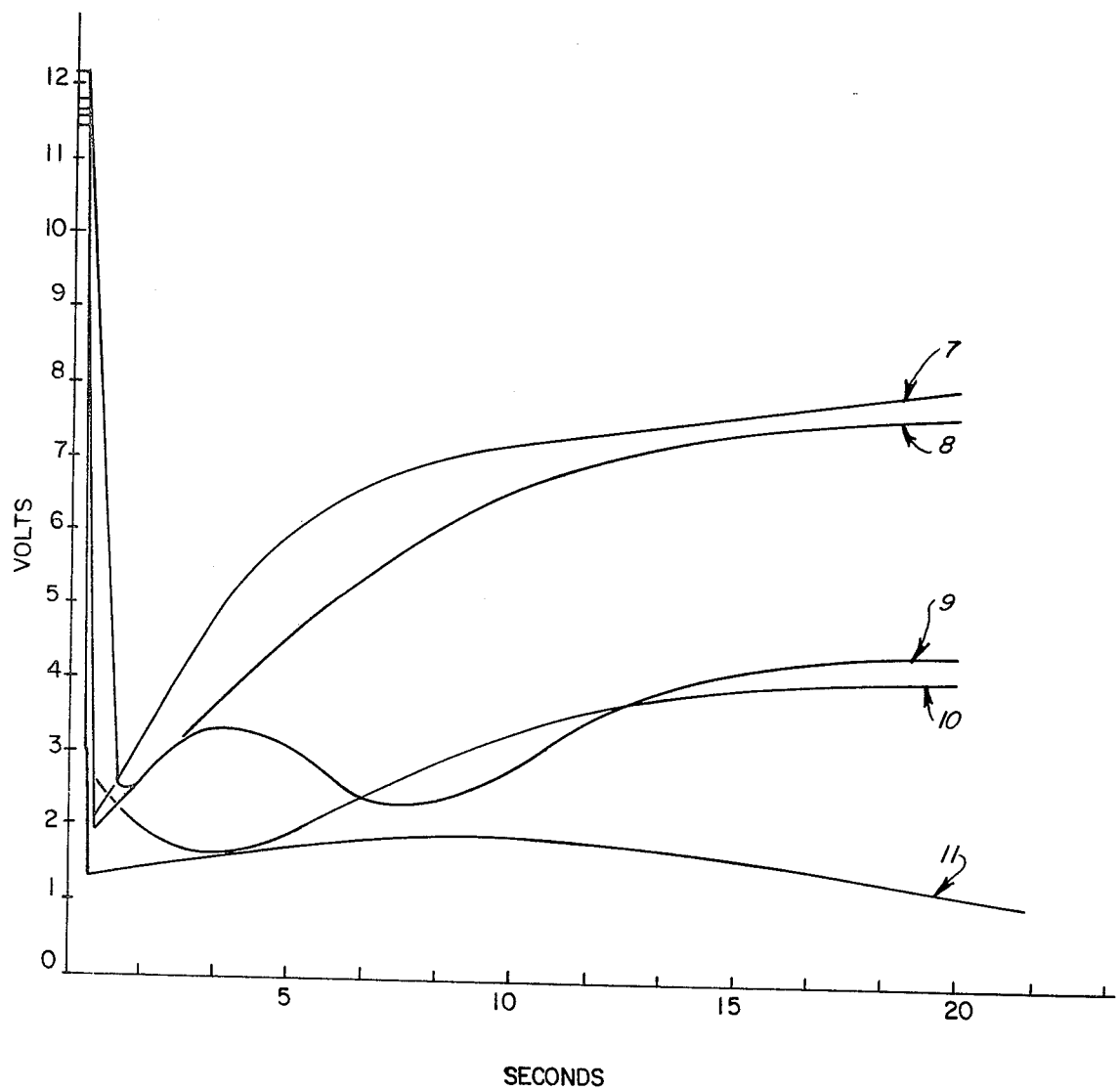

In the prior application Ser. No. 863,925 referred to above, a battery analyzer was disclosed which included apparatus for performing a load test and a voltage bounce back test similar to those described in items 2 and 3 above; those tests will not be discussed in detail herein. FIGS. 1 and 2 of the drawing are graphs showing the relationship between terminal voltage and time for a plurality of six cell, lead-acid storage batteries having a nominal 12 volt terminal voltage for the first 20 seconds following the placing of a 0.1 ohm., resistive load across the battery terminals. In FIG. 1, each of the batteries was known to be an acceptable one but to have been discharged to some degree, whereas in FIG. 2, each of the batteries was known to have at least one defective cell. In analyzing the graphs of both FIGS. 1 and 2, it is assumed that the voltages measured during approximately the first five seconds of the discharge are essentially unreliable because of the effects of an initial surge of battery current and heating of the resistive load during this time period. Each of the batteries represented by curves 1-5 of FIG. 1 was able to hold an approximately constant terminal voltage during the fifth through the twentieth seconds of the discharge and was found to be an acceptable battery but in need of recharging before it should be returned to service. The condition of the battery represented by curve 6 of FIG. 1 having a terminal voltage which decreased significantly during the fifth through the fifteenth seconds was found to be essentially indeterminable without first recharging it. Each of the batteries represented by curves 7-11 of FIG. 2 had a terminal voltage which increased significantly, i.e., had a positive rate of change, during at least a portion of the fifth through the twentieth second time period and was found to have at least one defective cell.

Figure 3:
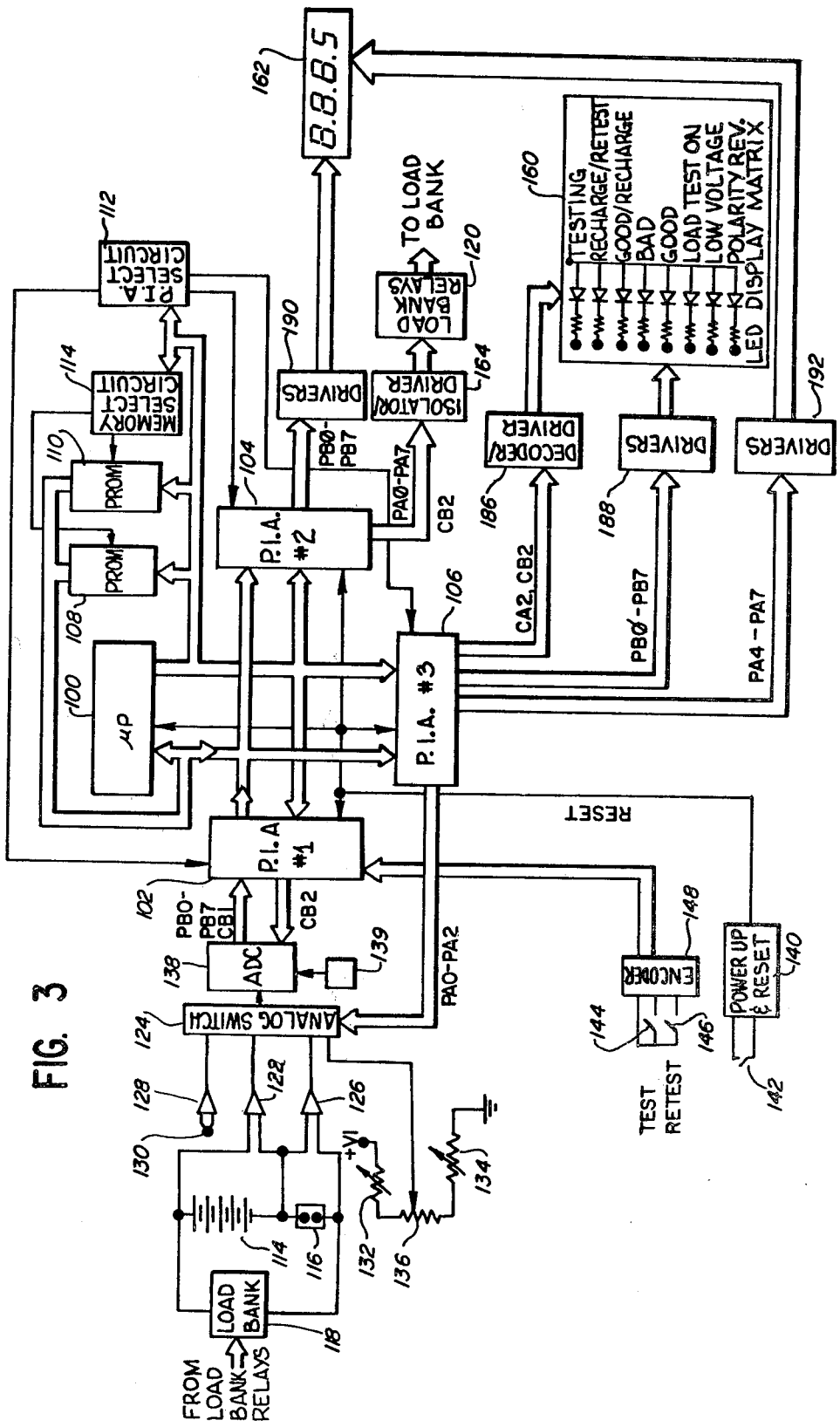
FIG. 3 is a diagram partly in block form and partly in a schematic form of an automatic battery analyzer including the preferred embodiment of this invention.
Figure 4:
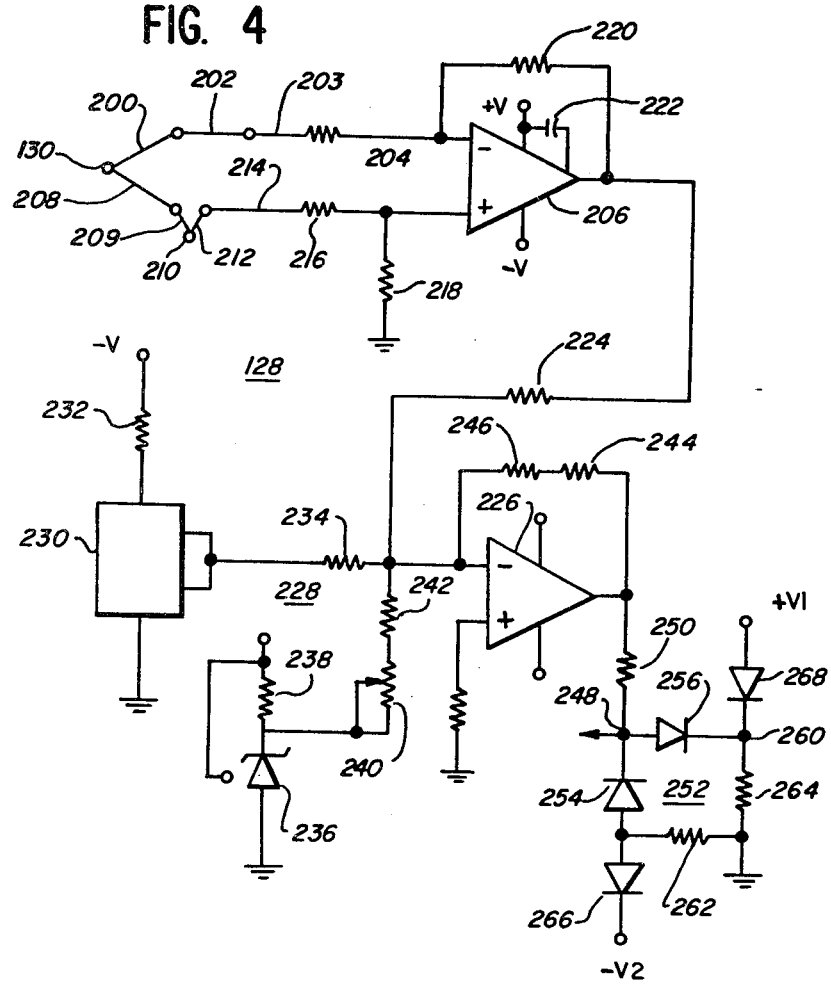
FIG. 4 is a schematic diagram of the temperature sensing circuit of the apparatus of FIG. 3.
Figure 5:
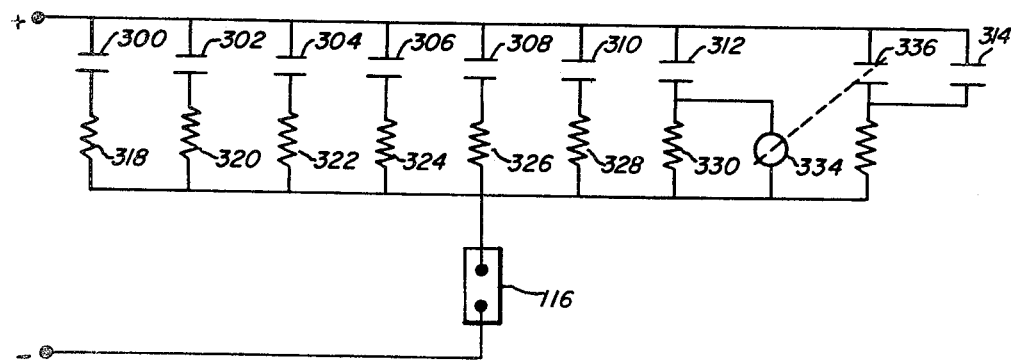
FIG. 5 is a schematic diagram of the load bank of the apparatus of FIG. 3.

There is disclosed in the remaining figures of the drawing apparatus for analyzing lead-acid, automotive, starting, lighting and ignition batteries making use of the observations referred to in the preceeding paragraph. FIG. 3 is a block diagram of an automatic battery analyzer apparatus incorporating this invention and FIGS. 4 and 5 are schematic diagrams of particular circuits of the apparatus of FIG. 3. The apparatus of FIGS. 3-5 as actually constructed included provisions for analyzing portions of an automobile other than the battery. As those other provisions form no part of the present invention, they are not included in the following description to the extent feasible to avoid obscuring the present invention.

The automatic battery analyzer disclosed in FIG. 3 includes a microprocessor controller circuit 100, first, second, and third peripheral interface adapters (PIA's) 102, 104, and 106, respectively, for interfacing various input and output circuits to the microprocessor 100, and two programmable read only memory circuits 108 and 110 for storage of the program used to control the operation of the microprocessor 100. The microprocessor 100 is an MC6802 and each of the PIA's is an MC6821 available from Motorola Semiconductor Products Inc., Austin, Texas; extensive information concerning the interconnections, use, and programming of these devices is available from Motorola Semiconductor Products Inc. Equivalent devices manufactured by others could be used and corresponding information concerning such devices is available from their respective manufacturers. The memories 108 and 110 are known by the industry standard designation 2716 and are each 8 bits by 2048 words; they are commercially available from a number of different manufacturers. Only the interconnections of the address bus (a sixteen line bus indicated as A0-A15 in FIG. 4), the data bus (an eight line bus indicated as D0-D7), and the reset line between the microprocessor, the PIA's, and the memories are indicated in FIG. 3 as the remainder of the necessary interconnections will be apparent to those familiar with the published information concerning these devices. Further detail is unnecessary and would unnecessarily complicate this description and perhaps obscure the invention. Similarly, only the connections between the PIA input/output data lines and control lines and the various input and output devices are shown in FIG. 3.

Each of the PIA's 102, 104, and 106 includes A and B side eight bit, input/output data registers (PA0-PA7 and PB0-PB7), and A and B side two bit control registers (CA1, CA2, CB1, and CB2). Address lines A0 and A1 are connected to register select inputs of each of the three PIA's 102, 104, and 106, and a PIA select circuit 112 has inputs coupled to address lines A2, A3, A7, and A15 and outputs coupled to device select inputs of the three PIA's 102, 104, and 106 such that decoding of the address lines occurs placing the PIA registers at the addresses shown in Table 1 hereinafter. Address lines A0–A10 are connected to address inputs of the memories 108 and 110 and a memory select circuit 114 has inputs coupled to address lines A13, A14, and A15 and outputs coupled to device select inputs of memories 108 and 110 such that decoding of the address lines occurs placing the memories at hexadecimal addresses FOOO-FFFF.

The input information to the automatic battery analyzer of FIG. 3 is supplied through the first PIA 102. The battery under test 114 has its negative terminal coupled through connector 12 and through a low resistance current shunt 116 to one terminal of a variable resistance load bank 118. The positive terminal of battery 114 is coupled to a second terminal of load bank 118. The variable resistance load bank 118 is connected to an operated by a set of load bank relays 120 and is effective to place a variable resistance load across the battery under test. The magnitude of that load is determined by which one or ones of the load bank relays 120 are closed. A differential amplifier circuit 122 is provided having its inputs coupled across the battery under test 114 and its output coupled to one signal input of an analog switch 124. A differential amplifier circuit 126 has its inputs coupled across the current shunt 116 and has its output coupled to another signal input of analog switch 124. The signals at the outputs of amplifier circuits 122 and 126 are responsive to the voltage across and the current through the battery under test, respectively, at any instant of time. A temperature sensing circuit 128 includes a thermocouple 130 physically located at the connector 12 coupled to the negative terminal of the battery under test; the circuit 128 will also be described in further detail hereinafter. An output of circuit 128 is responsive to the temperature of thermocouple 130 and is coupled to a third signal input of analog switch 124. The series connection of two variable resistances 132 and 134 and a potentiometer 138 is connected between a positive supply source +V and circuit ground with the tap on potentiometer 136 being coupled to a fourth signal input of analog switch 124. Potentiometer 136 is calibrated so that the user may adjust it to a position corresponding to the cold cranking rating of the battery under test whereas variable resistors 132 and 134 are used for calibration. The analog switch 124 is effective to develop at an output a signal responsive to that present at a selected one of its signal inputs and has input select inputs coupled to data lines PA0–PA2 of the A side of the third PIA 106. The output of analog switch 124 is coupled to the input of a three and one-half digit analog-to-digital converter 138. The data lines PB4–PB7 of the first PIA 102 are coupled to the digit select lines of analog-to-digital converter 138, the outputs of analog-to-digital converter 138 are coupled to the data lines PBO–PB3 of the first PIA 102, and the data update input terminal and the end of conversion output terminal of the analog-to-digital converter 138 are coupled to the control lines CB2 and CB1, respectively, of the first PIA 102. A voltage reference source 139 is also coupled to the analog-to-digital converter 138. Thus, signals representing separate digits of the battery current and voltage and connector temperature are applied to the microprocessor data bus by the first PIA 102 in response to the generation of proper signals by the first and third PIA's 102 and 106. Analog switch 124 and analog-to-digital converter 138 may comprise, respectively, MC14051 and MC14433 units available from Motorola Semiconductor Products, Inc. with appropriate associated circuitry.

A power up and reset circuit 140 is provided for resetting the microprocessor 100 and PIA's 102, 104, and 106 when power is initially applied to the battery analyzer. The circuit has an output providing a signal to the reset inputs of the microprocessor 100 and each of the PIA's 102, 104, and 106 of proper magnitude and duration to cause resetting of these units to their initial condition. A "Stop" switch 142 is coupled to the circuit 140 for manual actuation so that an operator may stop a test in progress by closing the switch and resetting the microprocessor and the PIA's. Two manually operated switches 144 and 146 labelled "Test" and "Retest" are coupled to a switch encoder circuit 148. Manual operation of these switches indicates either that the operator desires to perform an initial test on the battery or that he wishes to retest a battery previously tested for reasons which will be discussed subsequently. Encoder circuit 148 is effective to apply an appropriate code to data lines PA0–PA3 of first PIA 102 in response to the status of switches 144 and 146.

Three forms of output devices are driven by the second and third PIA's 104 and 106, the variable resistance load bank 118 previously described, a light emitting diode display matrix 160, and a three-and-one-half digit display 162. The data lines PA0–PA7 and control line CB2 of the second PIA 104 are each individually coupled through one of a set of optically coupled isolators and drivers 164 to a relay in a set of load bank relays 120 such that the signals on those lines are each operative to control the operation of one of the relays. The relays controlled by data lines PA0–PA6 determine the magnitude of a variable resistance load placed across the battery under test with each controlling the current flow through one of a set of seven resistances connected in parallel. A schematic drawing of the load bank 118 with the associated relay contacts of the load bank relays 120 as well as the shunt 116 is shown in FIG. 5. The positive terminal of the battery under test is coupled to one contact of each of eight normally open pairs of contacts 300, 302, 304, 306, 308, 310 312, and 314. The other contacts of each of those pairs is connected to one terminal of a resistor 318, 320, 322, 324, 326, 328, 330, and 332, respectively, the other terminal of those resistors being connected together to the shunt 116. The relative magnitudes of the six resistors 318–328 are in binary increments with resistors 328 having the least resistance, and the magnitudes of the three resistors 328–332 are equal. A relay coil 334 is coupled across resistor 330 and operates a normally open contact pair 336 coupled in parallel with the contact pair 314. The relays 300–312 are operated in response to the signals on data lines PA0–PA6 of the second PIA 104, respectively, whereas relay 314 is operated in response to the signal on control line CB2 of the same PIA. Relays 300–312 and their associated resistors are effective to place a variable resistance load across the battery under test, but relay 314 is effective to place a fixed resistance load across the battery.

The light emitting diode matrix 160 includes 8 separate series combinations of a resistor and a light emitting diode, the light emitting diodes 170, 172, 174, 176, 178, 180, 182, and 184 being labelled to indicate "Testing" or test in progress, "Recharge/Retest", "Good/Recharge", "Bad", "Good", "Load Test On", "Low Voltage", and "Polarity Reversed", respectively. Control lines CA2 and CB2 of the third PIA 106 are coupled to a decoder/driver circuit 186 to enable one of the vertical matrix lines of the matrix 160, only one such vertical matrix line actually being shown in the apparatus of FIG. 3. Data lines PB0-PB7 of the third PIA 106 are individually coupled through one of a set of drivers 188 to the light emitting diode/resistor series combinations of the matrix 160 in order to appropriately select a particular one of the diodes for energization.

The digit display 162 would normally not be used with the battery analyzer of FIG. 3, but may be used when it is desired to know the value of the voltage appearing at the output of the analog switch 124 at any particular time. A manually operated switch, not shown, is coupled to data line PA3 of the third PIA 106 for coupling that line to circuit ground when no such display is desired and to a positive potential when such a display is desired. The data lines PB0-PB7 are individually coupled through one of a set of drivers 190 of PIA 106 to the segment and decimal point select lines of the display 162 and the data lines PA4-PA7 are individually coupled through one of a set of drivers 192 to the digit select lines of the display 162.

FIG. 4 is a detailed schematic diagram of the temperature sensing circuit 128 used to develop a signal responsive to the temperature of thermocouple 130. The thermocouple 130 is comprised of a copper/constantan junction. The copper side of that junction is coupled through copper lines 200, 202, and 203, and through a resistor 204 to the inverting input of a differential amplifier 206. The constantan side of that junction is coupled through constantan lines 208 and 209 to another copper/constantan junction 210 and then through copper lines 212 and 214 and through a resistor 216 to the non-inverting input of amplifier 206, that input also being coupled to ground through a resistor 218. Feedback is provided through a resistor 220 coupled from the output of differential amplifier 206 to its inverting input. Differential amplifier 206 is coupled to positive and negative supply voltages +V1 and −V1, respectively, and a capacitor 222 is coupled from the positive power supply for the differential amplifier to the frequency compensation input thereof. The output of differential amplifier 206 is coupled through a resistor 224 to the inverting input of another differential amplifier 226.

A temperature compensating network 228 is also coupled to the inverting input of differential amplifier 226. Network 228 includes a temperature transducer 230 having its power supply terminals coupled to circuit ground and through a resistor 232 to the negative supply voltage −V1. The output of the transducer is coupled through a resistor 234 to the inverting input of differential amplifier 226. The copper/constantan junction 210 is placed in physical contact with the temperature transducer 230 so that the transducer is responsive to the temperature of that junction. A reference diode with built-in heat source 236 (e.g., an LM399Z) is included having its anode coupled to circuit ground, its supply input for the heat source coupled to the positive voltage supply +V1, and its cathode coupled to the positive supply +V1 through a resistor 238 and to the inverting input of amplifier 226 through the series combination of a variable resistor 240 and a fixed resistor 242.

The output of differential amplifier 226 is coupled both to the inverting input thereof through the series combination of two resistors 244 and 246 to provide feedback and to an output terminal point 248 through a resistor 250. The output terminal point 248 is coupled to one input of the analog switch 124. A protection circuit 252 is also coupled to output circuit point 248 to limit the magnitude of the potential at that circuit point and protect the input to analog switch 124 from excess potential. That network includes first and second diodes 254 and 256 having their cathode and anode terminals, respectively coupled to output circuit point 248 and their other terminals coupled to circuit points 258 and 260, respectively. Those latter two circuit points are each coupled to ground through resistor 262 and 264 with circuit point 258 being also coupled to the anode of a diode 266 having its cathode coupled to a second negative voltage supply −V2 of greater voltage (i.e., less negative) than the first negative voltage supply −V1 and circuit point 260 also being coupled to the cathode of a diode 268 having its anode coupled to a second positive voltage supply +V2 of lesser voltage than the first positive voltage supply +V1. The temperature sensing circuit 128 provides an output of approximately 20 millivolts per °F. The solid state temperature transducer 230 compensates for changes in temperature of the reference junction 210. The reference diode 236 and associated resistors provide a constant, temperature stable, offset voltage.

Figure 6A:
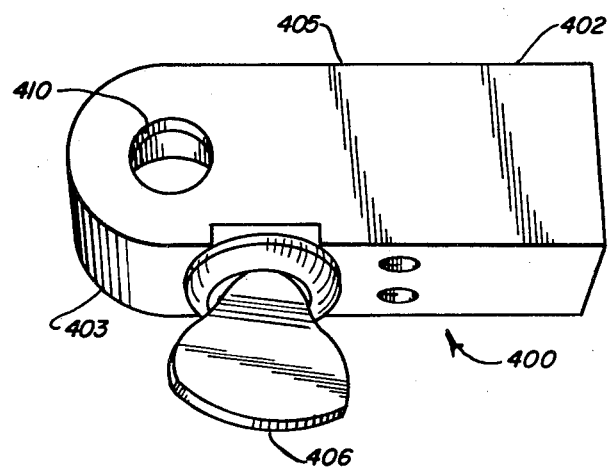
FIGS. 6a–6c show the brass connector of the apparatus of FIG. 3 for connection to the negative terminal of the battery under test.
Figure 6B:
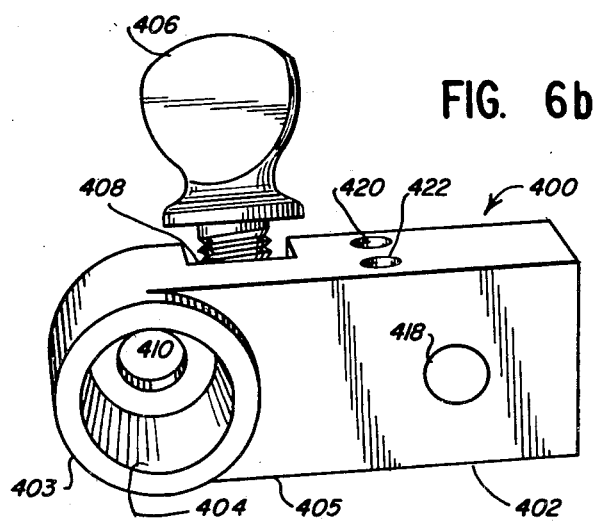
Figure 6C:
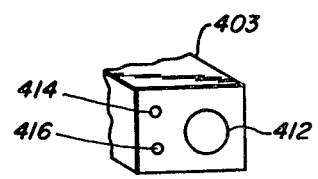
Figure 7A:
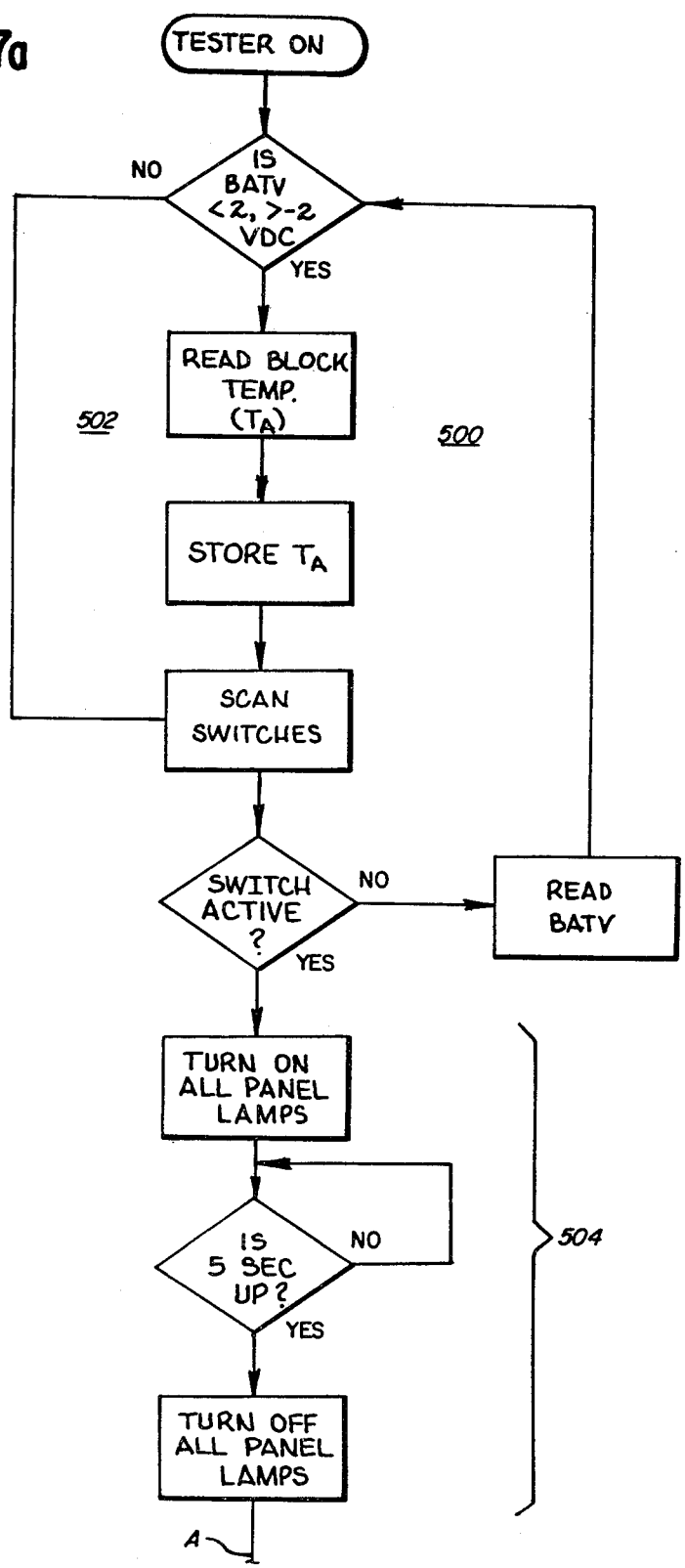
FIGS. 7a–7e are a flow diagram of the apparatus of FIG. 3.
Figure 7B:
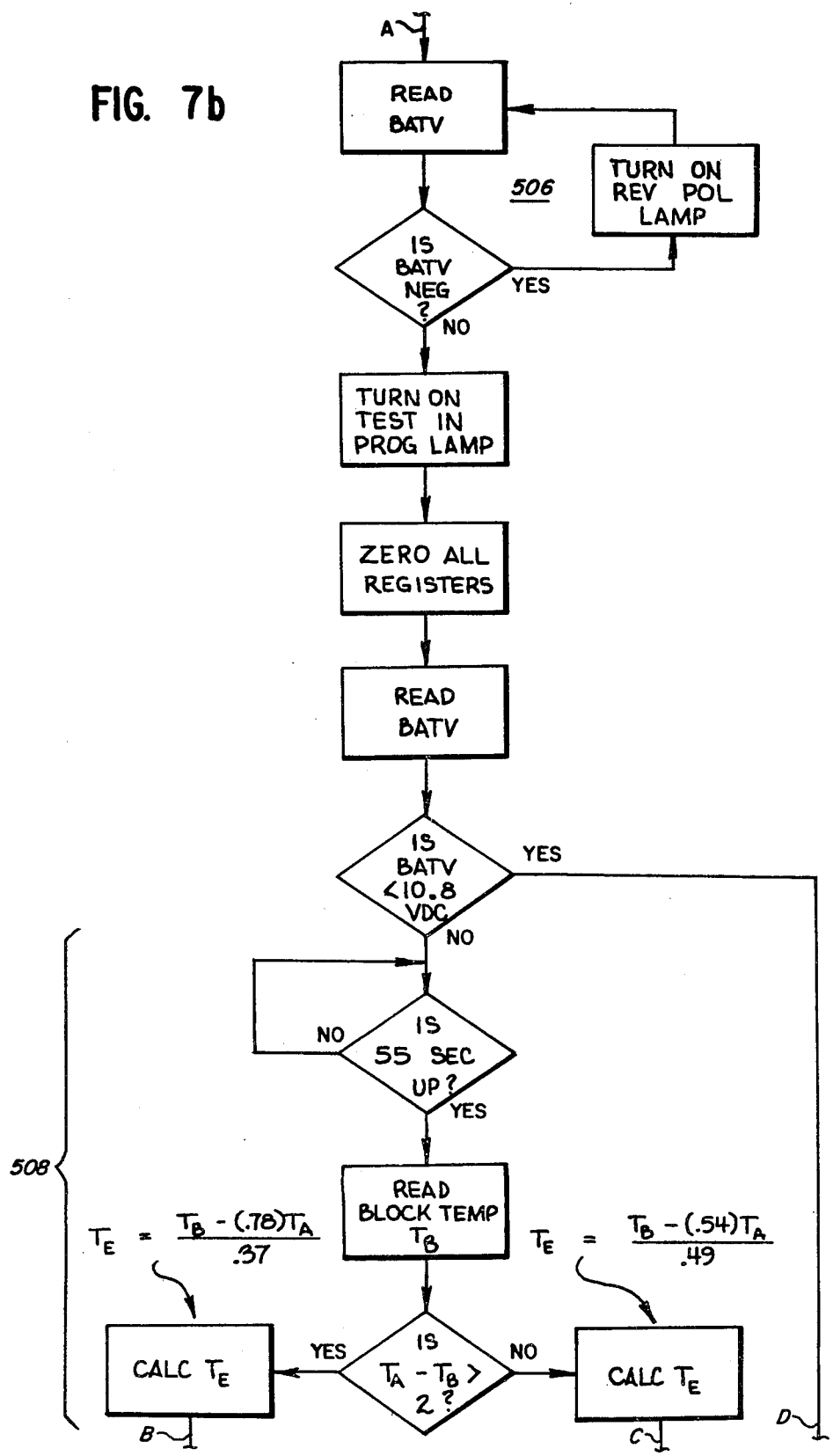
Figure 7C:
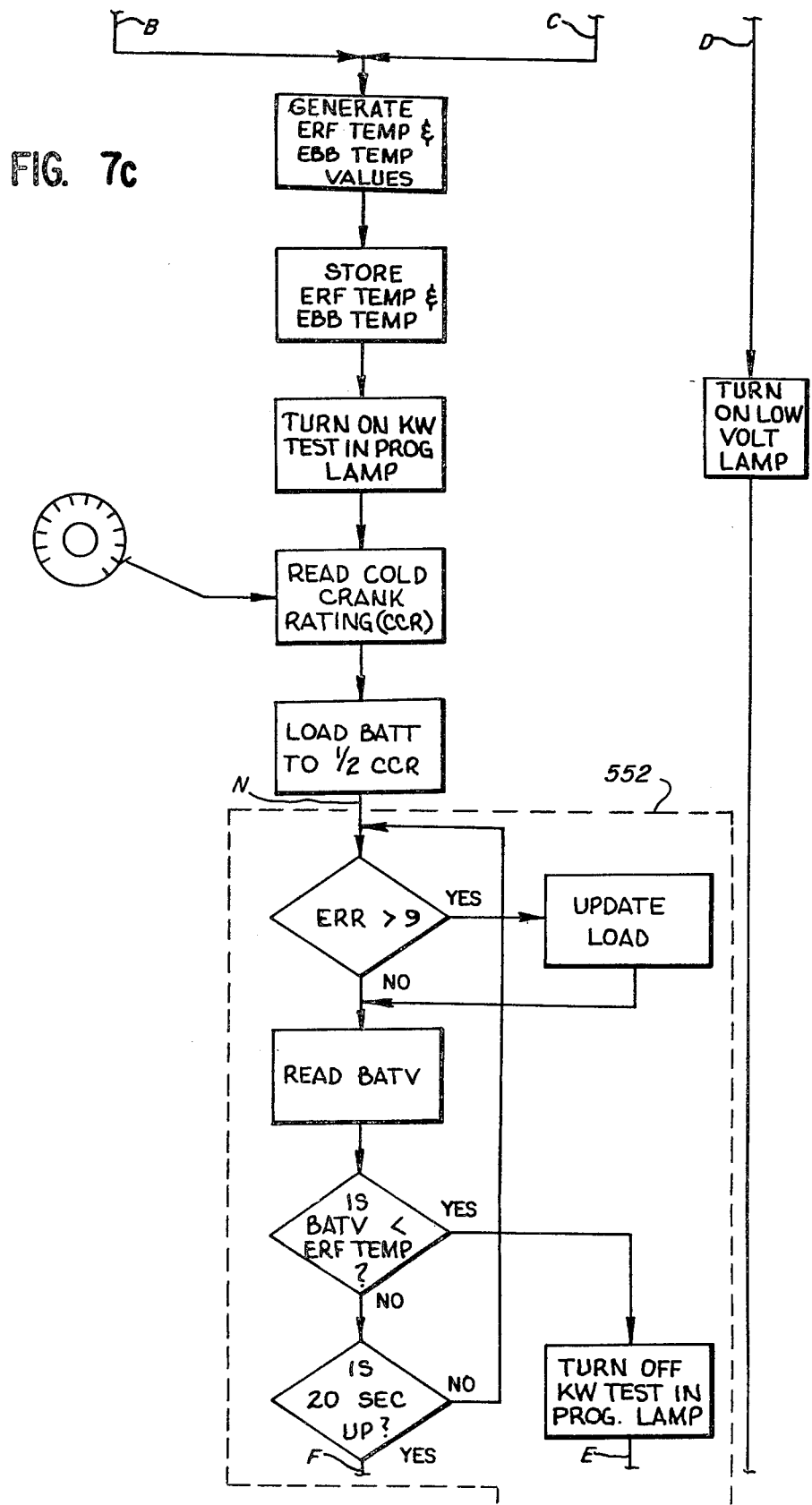
Figure 7D:
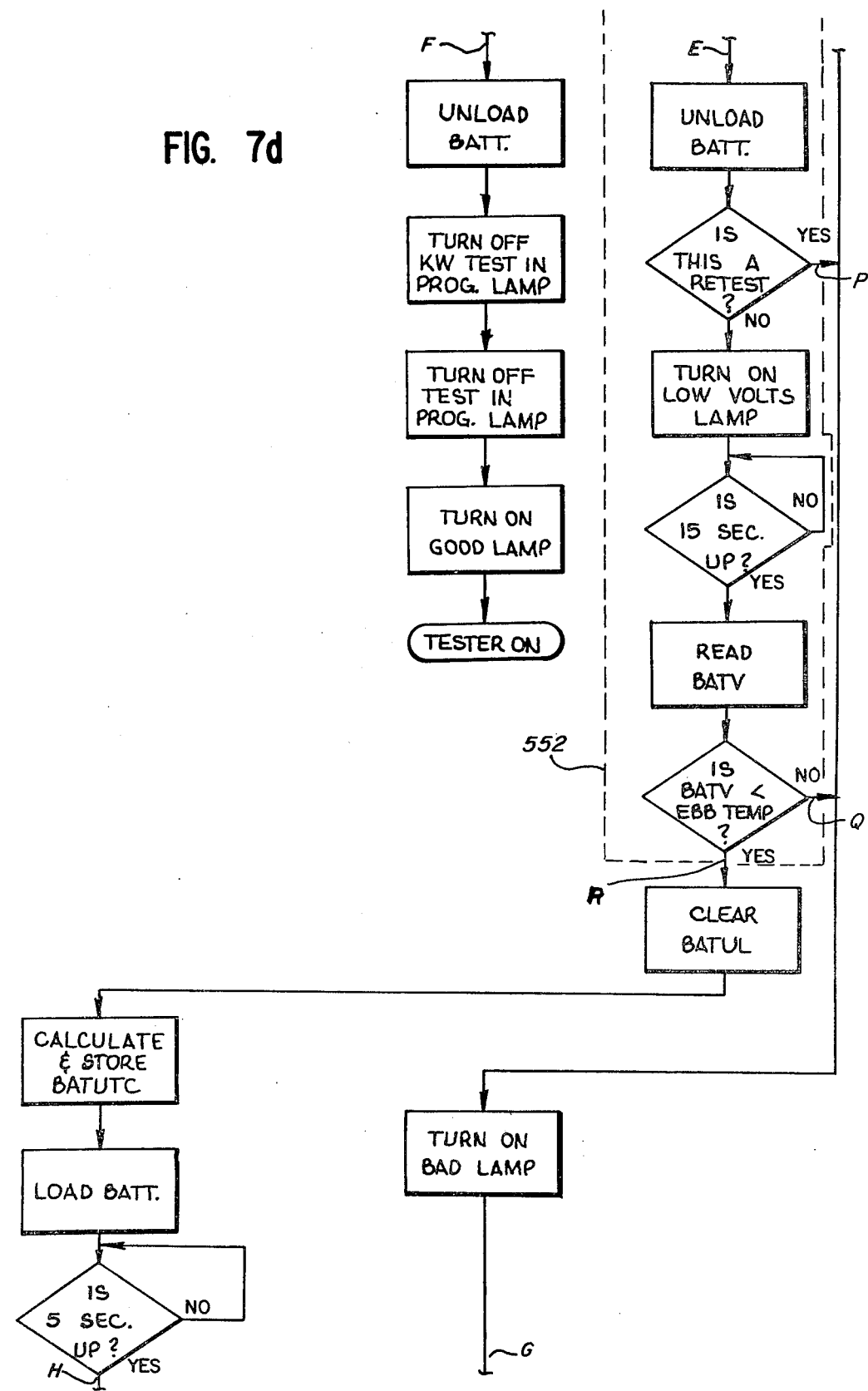
Figure 7E:
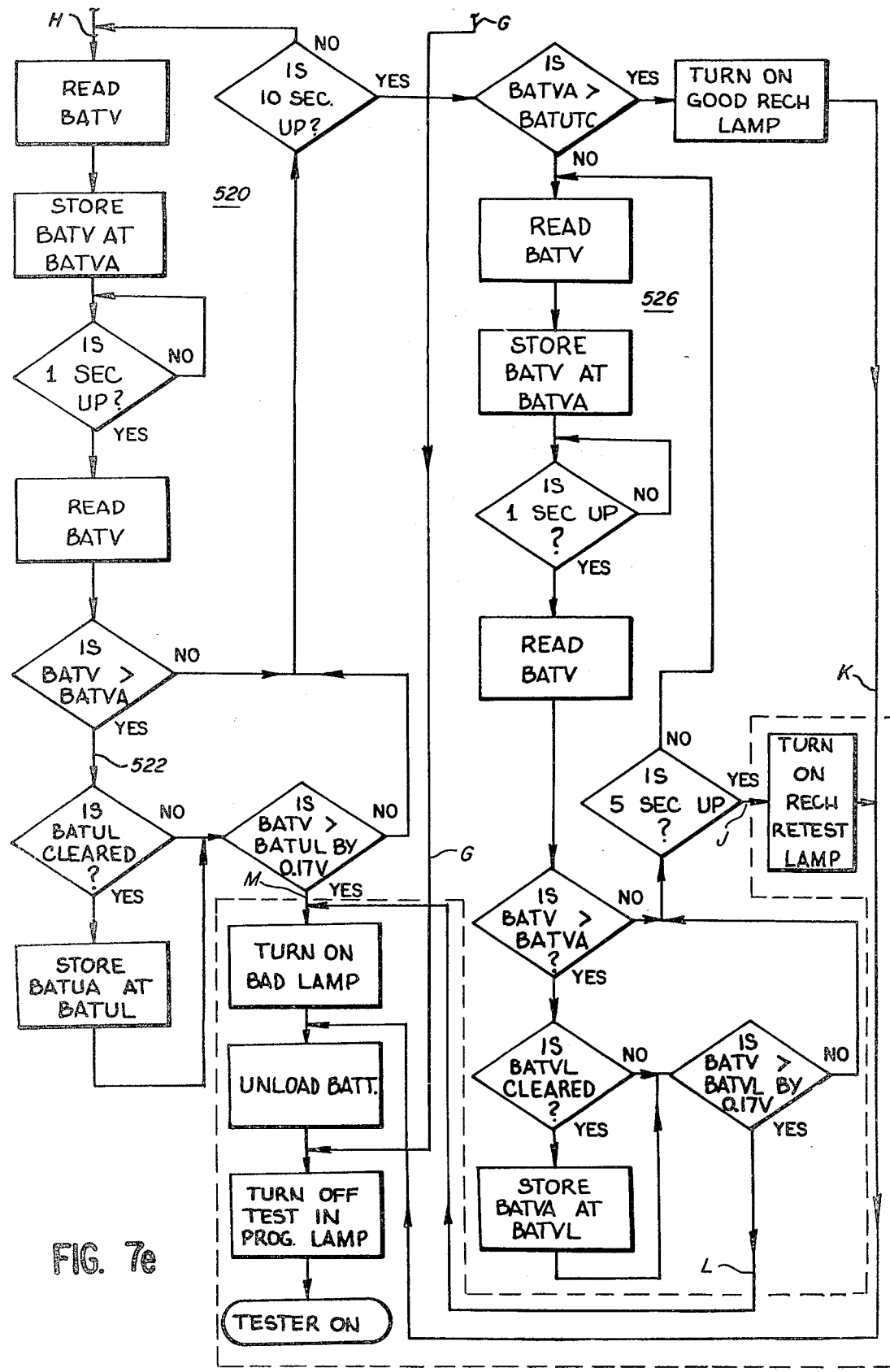

The thermocouple 130 is physically located within a connector 400 attached to the negative post of the battery under test. The connector 400 is disclosed in FIGS. 6a-6c. The connector includes a connector block 402 having a circular portion 403 and a shank portion 405. A receptacle opening 404 on one side of circular portion 403 extends partway through the connector block for receiving the negative post or terminal of the battery under test. Receptacle opening 404 may be tapered so that the connector block 402 may easily be fit snugly onto the negative post of the battery under test. A thumbscrew 406 is provided which screws into a threaded opening 408 in the connector block 402. Opening 408 is disposed so that as thumbscrew 406 is advanced into it, a portion of the thumbscrew extends into the receptacle opening 404 so as to firmly attach the connector 402 to the battery negative post. An opening 410 is provided in circular portion 403 on the other side of receptacle opening 404 and extending through the connector block into communication with the receptacle opening. When the battery analyzing apparatus is connected to a battery having a threaded opening in the top of the negative post, such as are typical on side post automotive batteries, the thumbscrew 406 may be placed through opening 410 and advanced into the threaded opening on the battery post to secure the connector block 402 to the battery post.

The connector block shank portion 403 additionally has three openings 412, 414, and 416 at the base thereof and extending lengthwise through it. Opening 412 is sufficiently large to receive the electrical conductor which is coupled to the current shunt 16, whereas opening 414 need only be sufficiently large to receive the conductor coupled to the inputs of amplifier circuits 122 and 126. Opening 416 is of sufficient diameter to receive thermocouple 130 and its connecting wires 200 and 208 and retain the thermocouple 130 in thermal contact with the connector block 402. Opening 416 extends through the shank portion 405 into the circular portion 403 to permit the thermocouple 130 to be in thermal contact with the connector block 402 at a position relatively close to the receptacle opening 404. Threaded openings 418, 420, and 422 are provided in the connector block 404 and each is in communication with one of openings 412, 414, and 416, respectively, for receiving set screws to retain the associated conductors in the openings 412, 414, and 416. In an apparatus constructed in accord with this invention, the connector block had an overall length of 2.50 inches, a width of 1.00 inches, and the circular portion 403 and the shank portion 405 had thicknesses of 0.79 and 0.70 inches, respectively.

A flow chart disclosing the operation of the automatic battery analyzer of FIGS. 3–6 is shown in FIGS. 7a–7e, the presence of the same reference letters on different lines of those FIGS. 7a–7e indicating that those lines are connected together. As soon as the automatic battery analyzer is turned on by applying power thereto, a loop 500 is entered which successively measures and stores the temperature of the connector block 402, scans the pushbutton switches 144 and 146 to see if either one has been closed, and measures the potential across the battery connectors. As long as the voltage across the battery connectors is within the range of plus or minus 2.0 volts, it is assumed that the battery analyzer has not yet been connected to the battery under test and that the measured temperature of the connector block, $T_A$, is the ambient temperature. When the measured voltage across the battery connector is outside the plus or minus 2.0 volt range, a second loop 502 is entered which skips the temperature measurement and storage steps of loop 500 since the connector block is no longer at ambient temperature but is at some temperature between the ambient temperature and the battery post temperature. Thus, after the connector is attached to the battery under test, the stored value of $T_A$ is temperature of the connector measured at the most recent time prior to connection of the connector to the battery.

When either of switches 144 or 146 is closed, a lamp test procedure 504 is performed by which all of the light emitting diodes 170–184 are simultaneously illuminated for a period of five seconds so that the operator may verify that each of them is functional. Another loop 506 is then entered which reads the battery voltage and, if that voltage is negative, turns on the light emitting diode 184 indicating to the operator that he has incorrectly connected the battery analyzer to the tester and that the positive and negative connectors should be reversed. If this occurs, the analyzer returns to the loop 500 when it is disconnected from the battery under test. After loop 506, the light emitting diode 170 is turned on to indicate that a test is in progress, the appropriate registers are set to zero, and the battery voltage is again read. If the battery voltage is less than 10.8 volts (for a nominal 12 volt battery) at the commencement of the test with no load applied to it, the battery is assumed to be unacceptable, light emitting diode 176 is turned on indicating that the battery under test is unacceptable, light emitting diode 182 is turned on indicating that the battery terminal voltage is excessively low, light emitting diode 170 is turned off indicating the test has terminated, and the analyzer returned to loop 502 and, after the bad battery is disconnected from the analyzer, to loop 500, in readiness for the next test.

If the battery voltage at the beginning of the test is greater than 10.8 volts, a procedure 508 is performed to determine the temperature of the battery under test. The nature of this procedure is more fully described and discussed in the copending application of G. A. Karnowski and D. V. Sriramamurty entitled "Storage Battery Electrolyte Temperature Measuring Apparatus", attorney's Ser. No. 126,172 filed date Feb. 29, 1980, and being filed contemporaneously herewith. First a fifty-five second time delay is introduced which, when added to the five second period of the lamp test routine 504, yields a total time delay for sixty seconds from the time the switch 144 or 146 was closed. At the end of that sixty second period the temperature of the connector block, $T_B$, is measured. In the disclosed apparatus, two possible routines are used to determine battery temperature, $T_E$, depending upon whether the difference between $T_A$ and $T_B$ is greater than 2° F. If that difference is greater than 2° F., the battery temperature is calculated as follows:

$$T_E = (T_B - 0.78 T_A)/0.37$$

If the difference not greater than 2° F., the battery temperature is calculated as follows:

$$T_E = (T_B - 0.54 T_A)/0.49$$

After the battery temperature is determined, that temperature is used as an input to the testing procedure carried out. In the analyzer of FIGS. 3–7, load and bounce back tests similar to those used in the aforementioned Ser. No. 863,925 are used, but the third test used is one which detects the presence of a bad cell within the battery under test. As the first step in performing the load and bounce back voltage tests, the load and bounce back reference voltages are determined from the determined battery temperatures and stored in memory. The calculated reference voltages are referred to as ERFTMP and EBBTMP in FIG. 7 and Table 1. The relationships between the two reference voltages and battery temperature are shown in FIGS 4a and 4b of said application Ser. No. 863,925. At the initiation of the load test, light emitting diode 180 is illuminated to indicate that the load test is in progress and the cold cranking rating of the battery is read from the potentiometer 136 previously adjusted by the operator to correspond to the cold cranking rating of the battery under test. That rating is a value in amperes and is the current the battery is intended to be able to deliver for a period of thirty seconds at zero degrees Fahrenheit without the battery terminal voltage falling below 7.2 volts for a conventional, six-cell, twelve volt lead-acid storage battery. The relays in the load bank relays 120 are then closed to place the corresponding resistances across the battery under test and load it to deliver a current of approximately one-half its cold cranking rating. The battery current is monitored by measurement of the voltage across the shunt 116 and if the difference between the actual current and one-half the cold cranking rating is greater than approximately 9 amperes, the load is altered to bring the current closer to one-half of the cold cranking rating. The battery terminal voltage is measured during the load test. If at the end of twenty seconds that voltage exceeds the previously determined ERFTMP the battery under test is assumed to be acceptable, the load is removed from the battery, light emitting diodes 180 and 170 are extinguished, light emitting diode 178 is energized to indicate that the battery under test has been determined to be acceptable, and the tester returns to loops 500 and 502 in preparation for the next test. If the battery terminal voltage falls below ERFTMP at any time during the load test, the battery is assumed to have failed the load test, light emitting diode 180 is extinguished, and the load is removed from the battery. In the event that load test failure occured while the battery under test is being retested and is known to have been fully charged (i.e., the test sequence was initiated by closure of pushbutton switch 146), the battery is then known to be unacceptable. Light emitting diodes 176 and 170 are illuminated and extinguished, respectively, and the analyzer is returned to loops 501 and 502 in preparation for the next test. If the load test failure occurred during an initial test of the battery, the voltage bounce back test is performed by measuring the battery voltage fifteen seconds after termination of the load test. If that measured voltage exceeds EBBTMP, the battery has passed the bounce back voltage test but is assumed to be unacceptable, light emitting diodes 176 and 170 are illuminated and extinguished, respectively, and the analyzer is returned to loops 500 and 502 in preparation for the next test. If that measured voltage is less than EBBTMP, the condition of the battery is still undetermined and the test to determine the presence of a bad cell is performed.

The first step in the bad cell detection test is to clear a register labelled BATVL. A temperature corrected standard voltage, BATVTC, is then calculated as follows:

$$BATVTC = [0.870 + (1.30 \times CCR)] \, (ERFTMP + 0.70)$$

A fixed resistance load of 0.1 ohm then placed across the battery by closing the contact pair 314. After a five second delay, a loop procedure 520 is executed during which the voltage across the battery terminals is measured each second and the result of each voltage measurement is compared with the voltage measurement made the previous second.

In the case of a normally operating battery, the voltage supplied to a fixed resistance load is a monotonically decreasing function of time after an initial period of discharge. Here the initial period is taken as five seconds. If after that initial period and while the constant resistance load is across the battery terminals the terminal voltage measured at any time exceeds the voltage measured the preceeding second, it is known that the terminal voltage is increasing, i.e., that its rate of change is positive. The first time the measured battery voltage exceeds the voltage measured in the previous second, the previously measured voltage is stored in the BATVL register. That stored voltage is assumed to be the minimum battery voltage. if while the constant resistance load is across the battery terminals, the measured battery terminal voltage exceeds the minimum battery terminal voltage by 0.17 volts, the battery is assumed to have a bad cell and thus to be unacceptable, light emitting diode 176 is illuminated, the relay contacts 314 are opened to remove the load from the battery, light emitting diode 170 is extinguished, and the tester returns to loops 500 and 502 in preparation for the next test.

Loop 520 is also exited after a ten second time period at point 524. If at that time the battery terminal voltage measured during the proceeding second exceeds the previously determined BATVTC, the battery is assumed to be acceptable but in need of a recharge before being returned to service; in this case light emitting diode 174 is illuminated to make the proper indication to the operator, relay contacts 316 are opened to remove the load from the battery, light emitting diode 170 to extinguished, and the tester returns to loops 500 and 502 in preparation for the next test. If at that same time the battery terminal voltage measured during the proceeding second does not exceed the previously determined BATVTC, a loop 526 is entered which is quite similar to the loop 520 and carries out the constant resistance load test for another five seconds while continuing to look for increases in the battery terminal voltage. If the battery terminal voltage should increase during that additional five second period and if the battery terminal voltage should exceed by 0.17 volts the minimum value thereof obtained during either that period or the previous 10 second period, the battery is again assumed to have a bad cell and to be unacceptable, light emitting diode 176 and 170 are illuminated and extinguished, respectively, the load is removed from the battery, and the tester returns to loops 500 and 502 in preparation for the next test. If during that additional five second period the battery is not thus determined to be unacceptable, then it is assumed that insufficient information concerning the battery is available to determine its condition and the battery must be recharged and retested to determine its acceptability. In this case, light emitting diode 172 is illuminated to give the proper indication, the load is removed from the battery, light emitting diode 170 is extinguished, and the tester returned to loops 500 and 520 in preparation for the next test.

A program for the 6802 microprocessor in assembly language to execute the program of the flow charts of FIGS. 7a-7e is at Table I as follows:

```
                      GLOBE UNION BATTERY TESTER

00001                         OPT     PAGE=43,LLEN=110
00002                         OPT     S
00003                         TTL     GLOBE UNION BATTERY TESTER
00004                         NAM     BATT
              BATT    GLOBE UNION BATTERY TESTER
00006                         *   RAM DEFINITIONS; PIA DEFINITIONS
00007                         *
00008                         *THIS PAGE DEFINES ALL LABELS USED IN ALL PROGRAMS. IT
00009                         *ALSO DEFINES THE LOCATIONS OF THE 3 PIAS.
00010                         *
00011                         *
00012         0080   A PIA1AD EQU    $80
00013         0081   A PIA1AC EQU    $81
00014         0082   A PIA1BD EQU    $82
00015         0083   A PIA1BC EQU    $83
00016         0084   A PIA2AD EQU    $84
00017         0085   A PIA2AC EQU    $85
00018         0086   A PIA2BD EQU    $86
00019         0087   A PIA2BC EQU    $87
00020         0088   A PIA3AD EQU    $88
00021         0089   A PIA3AC EQU    $89
00022         008A   A PIA3BD EQU    $8A
```

```
00023           008B  A PIA3BC EQU    $8B
00024                 *
00025                 *
00026A 0000                    ORG    $0               BEGINNING OF RAM
00027A 0000     0001  A LINDEL RMB    1                A/D DELAY TIME
00028A 0001     0001  A ATODN  RMB    1                A/D LINE NUMBER
00029A 0002     0004  A ATODD  RMB    4                MSD --- --- LSD
00030A 0006     0001  A DECPT  RMB    1                LOCATION OF DECIMAL POINT
00031A 0007     0002  A IXH    RMB    2                HIGH BYTE OF INDEX REGISTER
00032A 0009     0001  A LMPCOL RMB    1                LAMP COLUMN NUMBER KEEP IN 1
00033A 000A     0001  A LMPROW RMB    1                LAMP ROW NUMBER
00034A 000B     0001  A LMPST1 RMB    1                SCRATCH FOR LAMPS
00035A 000C     0001  A LMPST2 RMB    1                SCRATCH FOR LAMPS
00036A 000D     0001  A BCDNEG RMB    1                SIGN OF BCDTOH NUMBER
00037A 000E     0002  A DATAH  RMB    2
00038A 0010     0001  A STACK1 RMB    1
00039A 0011     0001  A NCTH   RMB    1
00040A 0012     0001  A NCTL   RMB    1
00041A 0013     0002  A ETMPH  RMB    2                ETMP=TEMP COMPENSATED VOLTAGE
00042A 0015     0002  A EBTMPH RMB    2
00043A 0017     0002  A TEMPHX RMB    2
00044A 0019     0001  A SPDONE RMB    1
00045A 001A     0001  A SPDZRO RMB    1
00046A 001B     0001  A SPDSTO RMB    1
00047A 001C     0001  A SPDFLP RMB    1
00048A 001D     0001  A SPDTRU RMB    1
00049A 001E     0002  A SPDPER RMB    2
00050A 0020     0001  A RIPSTA RMB    1
00051A 0021     0001  A ACNODS RMB    1                10 SEC COUNTER STORAGE
00052A 0022     0002  A BATVL  RMB    2
00053A 0024     0002  A BATVTC RMB    2
00054A 0026     0002  A BATVA  RMB    2
00055A 0028     0002  A CCSH   RMB    2
00056A 002A     0002  A VCTR10 RMB    2
00057A 002C     0001  A PIASTO RMB    1
00058A 002D     0001  A BATCTR RMB    1
00059A 002E     0001  A BCNSJR RMB    1
00060A 002F     0001  A VEHCTR RMB    1
00061A 0030     0001  A VEHDVD RMB    1
00062A 0031     0001  A XFIELD RMB    1
00063A 0032     0001  A REGCTR RMB    1
00064A 0033     0001  A DISCTL RMB    1
00065A 0034     0001  A ADIRQ  RMB    1
00066A 0035     0001  A ROLCNT RMB    1
00067A 0036     0001  A RELNUM RMB    1
00068A 0037     0001  A RELKA  RMB    1
00069A 0038     0004  A STRDRW RMB    4                STARTER CURRENT 1 KEEP
00070A 003C     0004  A ALTOUT RMB    4                ALTERNATOR CURRENT 2 IN
00071A 0040     0004  A VLTREG RMB    4                VOLTAGE REGULATOR 3 ORDER
00072A 0044     0004  A DISREG RMB    4                DISPLAY REGISTER
00073A 0048     0001  A CTR    RMB    1
00074A 0049     0002  A IXH1   RMB    2
00075A 004B     0001  A TEMPER RMB    1
00076A 004C     0001  A BCDCTR RMB    1
00077           004D  A DIVEND EQU    *
00078A 004D     0001  A        RMB    1                MOST SIGNIFICANT BIT IN DIVIDE
00079A 004E     0002  A MULCND RMB    2
00080A 0050     0002  A MULPYR RMB    2
00081A 0052     0002  A DIVSOR RMB    2
00082A 0054     0002  A RESULT RMB    2
00083A 0056     0001  A DLYTIM RMB    1
00084A 0057     0001  A KFLASH RMB    1
00085A 0058     0002  A POSTMV RMB    2
00086A 005A     0002  A AMBMV  RMB    2
00087A 005C     0002  A POSTTM RMB    2
00088A 005E     0002  A AMBTM  RMB    2
00089A 0060     0002  A NEWTMP RMB    2
00090A 0062     0002  A VALUE  RMB    2
00091A 0064     0001  A SETNEG RMB    1
00092A 0065     0001  A FSHFST RMB    1

PAGE 005   BATT   GLOBE UNION BATTERY TESTER

00094A F000                    ORG    $F000
00095                  *
00096                  *RESTART ROUTINE
00097                  *
00098A F000 8E 007F  A RESTAR LDS    #$007F           INITIALIZE STACK POINTER
00099A F003 0F              SEI                       SET THE INTERRUPT MASK
00100A F004 7F 0057  A         CLR    KFLASH
00101A F007 7F 0033  A         CLR    DISCTL
00102                  *
00103                  *INITIALIZE PIAS
00104A F00A 4F                 CLRA
00105A F00B 97 65    A         STAA   FSHFST          SET FOR SLOW FLASH FOR VEHICLE TEST
00106A F00D 97 81    A         STAA   PIA1AC
00107A F00F 97 83    A         STAA   PIA1BC
```

```
00108A F011 97 85    A         STAA   PIA2AC
00109A F013 97 87    A         STAA   PIA2BC
00110A F015 97 89    A         STAA   PIA3AC
00111A F017 97 8B    A         STAA   PIA3BC
00112A F019 86 FF    A         LDAA   #$FF
00113A F01B 97 84    A         STAA   PIA2AD   PIA2A=OUTPUT
00114A F01D 97 86    A         STAA   PIA2BD   PIA2B=OUTPUT
00115A F01F 97 8A    A         STAA   PIA3BD   PIA3B=OUTPUT
00116A F021 86 F7    A         LDAA   #$F7     ONE INPUT SEVEN OUTPUTS
00117A F023 97 88    A         STAA   PIA3AD
00118                          *
00119A F025 86 04    A         LDAA   #$04
00120A F027 97 81    A         STAA   PIA1AC   SELECT PERIPHERAL REGISTERS
00121A F029 97 83    A         STAA   PIA1BC
00122A F02B 86 34    A         LDAA   #$34     SELECT PERIPHERAL REGISTERS
00123A F02D 97 89    A         STAA   PIA3AC   AND SET CB2=CA2=0
00124A F02F 97 8B    A         STAA   PIA3BC
00125A F031 97 85    A         STAA   PIA2AC
00126A F033 97 87    A         STAA   PIA2BC
00127A F035 CE 5555  A         LDX    #$5555
00128A F038 DF 5A    A         STX    AMBHV    SET AMBIENT FOR 80 DEG. F
00129A F03A BD F06C  A         JSR    CLRGST   CLEAR STRDRW,ALTOUT,VLTREG
00130A F03D BD F658  A         JSR    LMPSOF   ALL LAMPS OFF
00131A F040 7E F65D  A         JMP    PCLEAR   SCAN PUSHBUTTONS
00132                          TTL    BATTERY TEST PROGRAM
00133                          NAM    BATEST
              BATEST BATTERY TEST PROGRAM
00135                    *         PROGRAM BATEST
00136                    *THIS PROGRAM TESTS THE BATTERY.  IT SENSES THE CURRENT
00137                    *THRU A LOAD BANK AND THE TERMINAL VOLTAGE.  IT LOADS
00138                    *THE BATTERY AND RECORDS DATA. SEE BLOCK DIAGRAM.
00139                    *
00140                    *
00141A F043 86 01    A RETEST LDAA   #$01
00142A F045 97 2E    A         STAA   BCNSTR   BCNSTR=1
00143A F047 20 03 F04C         BRA    BSTART
00144A F049 7F 002E  A BATEST CLR    BCNSTR
00145A F04C BD F658  A BSTART JSR    LMPSOF   TURN ALL LAMPS OFF
00146                          *
00147                    *TURN ON LAMPS FOR 5 SECONDS
00148                          *
00149A F04F CE 00FF  A         LDX    #$00FF   ALL LAMPS ON
00150A F052 BD F23E  A         JSR    LPONOF
00151                          *
00152                    *CHECK REVERSE POLARITY AND MAGNITUDE
00153                          *
00154A F055 BD F468  A BRDBAT JSR    RDBATV   GO READ BATV
00155A F058 96 0D    A         LDAA   BCDNEG   IS VOLTAGE NEGATIVE?
00156A F05A 2A 2E F08A         BPL    BATCLR   B=PLUS
00157A F05C 96 02    A         LDAA   ATODD    MOST SIG. DIGIT
00158A F05E 9B 03    A         ADDA   ATODD+1  ADD IN NEXT DIGIT
00159A F060 84 7F    A         ANDA   #$7F     STRIP SIGN
00160A F062 27 26 F08A         BEQ    BATCLR   B=POSITIVE
00161A F064 CE 0001  A BTPNEG LDX    #$0001   REV POLARITY ON
00162A F067 BD F7C9  A         JSR    LAMPS
00163A F06A 20 E9 F055         BRA    BRDBAT   GO READ AGAIN
00164                          *
00165                    *    SUBROUTINE CLRGST
00166                    *THIS SUBROUTINE CLEARS STRDRW,ALTOUT,VLTREG
00167                          *
00168A F06C CE 0035  A CLRGST LDX    #ROLCNT  GET ADDRESS OF REGISTERS
00169A F06F 6F 00    A BTMCLR CLR    0,X
00170A F071 08                 INX             NEXT ONE
00171A F072 8C 004C  A         CPX    #BCDCTR
00172A F075 26 F8 F06F         BNE    BTMCLR
00173A F077 39                 RET1   RTS
00174        F078    A RDTEMP EQU    *
00175A F078 97 01    A         STAA   ATODN    SELECT TEMP INPUT
00176A F07A BD F6A7  A         JSR    ATOD
00177A F07D 96 33    A         LDAA   DISCTL
00178A F07F 2B F6 F077         BMI    RET1
00179A F081 CE 0002  A BCDNOW LDX    #ATODD   ADDRESS OF DATA TO X
00180A F084 7E F81D  A         JMP    BCDTOH   CONVERT BCD TO HEX. DATAH=TEMP=X
00181        F087    A BADBAT EQU    *        BAD BATTERY
00182A F087 7E F1CA  A         JMP    BATBBN   BAD BATTERY LITE
00183                          *
00184                          *
00185A F08A 8D E0 F06C BATCLR BSR    CLRGST   CLEAR REGISTERS
00186                          *
00187A F08C BD F468  A         JSR    RDBATV   READ BATTERY VOLTAGE
00188A F08F C0 38    A         SUBB   #$38     IS VOLTAGE > 10.80
00189A F091 82 04    A         SBCA   #$4
00190A F093 2B F2 F087         BMI    BADBAT   B=NO
00191                          *
00192                          *
00193                    * SEE IF AMBIENT TEMPERATURE WAS READ
00194                          *
```

```
00195A F095 DE 5A     A           LDX    AMBMV
00196A F097 8C 5555   A           CPX    #$5555
00197A F09A 26 22 F0BE            BNE    DLYST
00198A F09C CE 00FF   A  BLINK    LDX    #$00FF    FLASH ALL BATTERY LIGHTS
00199A F09F BD F7C9   A           JSR    LAMPS
00200A F0A2 BD F4EB   A           JSR    WATQTR
00201A F0A5 BD F658   A           JSR    LMPSOF
00202A F0A8 4F                    CLRA
00203A F0A9 BD F468   A           JSR    RDBATV    READ BATTERY VOLTAGE
00204A F0AC 4D                    TSTA             SEE IF STILL CONNECTED
00205A F0AD 2B 08 F0B7            BMI    LSBTST
00206A F0AF 26 EB F09C            BNE    BLINK
00207A F0B1 C1 02     A           CMPB   #2        SEE IF > 2
00208A F0B3 2C E7 F09C            BGE    BLINK     BR. IF YES
00209A F0B5 20 04 F0BB            BRA    STOVER
00210A F0B7 C1 FE     A  LSBTST   CMPB   #-2       SEE IF > -2
00211A F0B9 25 E1 F09C            BCS    BLINK     BR IF YES
00212A F0BB 7E F000   A  STOVER   JMP    RESTAR
00213                            *READ TEMPERATURE
00214                            *
00215A F0BE 86 28     A  DLYST    LDAA   #$28      SET FOR 50 SEC. APPROX.
00216A F0C0 97 56     A           STAA   DLYTIM
00217A F0C2 4F           TMPAGN   CLRA             SELECT TEMP INPUT
00218A F0C3 8D B3 F078            BSR    RDTEMP    GO READ TEMP.
00219A F0C5 7D 004B   A           TST    TEMPER
00220A F0C8 2B F8 F0C2            BMI    TMPAGN
00221A F0CA CE 0080   A           LDX    #$0080    SET TEST IN PROGRESS LAMP
00222A F0CD BD F7C9   A           JSR    LAMPS
00223A F0D0 CE 03E8   A           LDX    #1000     WAIT 1 SEC.
00224A F0D3 BD F8E7   A           JSR    WAITFO
00225A F0D6 7A 0056   A           DEC    DLYTIM
00226A F0D9 26 E7 F0C2            BNE    TMPAGN
00227A F0DB 4F           STTMP    CLRA
00228A F0DC 8D 9A F078            BSR    RDTEMP    GO READ TEMP
00229A F0DE 7D 004B   A           TST    TEMPER
00230A F0E1 2B DB F0BE            BMI    DLYST
00231A F0E3 DF 58     A           STX    POSTMV    STORE POST TEMP FOR ADJUSTED TEMPERATURE CALC.
00232A F0E5 BD F9B5   A           JSR    CALFF     CALC. ADJ. TEMP.
00233A F0E8 DF 17     A           STX    TEMPHX    STORE TEMPERATURE IN HEX AT TEMPHX
00234                            *
00235                            *GENERATE ERFTMP, EBTMPH TEMPERATURE COMPENSATED
00236                            *REFERENCE VOLTAGE AND BOUNCE BACK VOLTAGE.
00237                            *
00238A F0EA BD F862   A           JSR    ERFTMP    TEMP COMP VOLTAGE=ETMPH=DDDD
00239A F0ED BD F8B9   A           JSR    EBBTMP    TEMP COMP BOUNCE BCK VOLT=EBTMPH
00240                            *
00241A F0F0 CE 0084   A           LDX    #$0084    TEST IN PROGRESS ON
00242A F0F3 BD F7C9   A           JSR    LAMPS     AND KW TEST IN PROGRESS ON
00243                            *
00244A F0F6 86 07     A           LDAA   #$7
00245A F0F8 BD F078   A           JSR    RDTEMP    GO READ COLD CRANK
00246A F0FB DF 28     A           STX    CCSH      CCSH=COLD CRNK SETTING IN HEX
00247                            *
00248A F0FD 86 33     A           LDAA   #$33      GO THRU 51X(.393 SEC) TIMES
00249A F0FF 97 2D     A           STAA   BATCTR    LOAD COUNTER FOR 20 SEC
00250A F101 7F 0036   A           CLR    RELNUM    RELNUM=0

00252                            *
00253                            *LOAD BATTERY DOWN
00254                            *
00255A F104 86 40     A           LDAA   #$40      SET XX.XX
00256A F106 97 06     A           STAA   DECPT
00257A F108 96 8B     A  BATLUP   LDAA   PIA3AD
00258A F10A 85 08     A           BITA   #$08
00259A F10C 26 07 F115            BNE    BTDISP
00260A F10E 86 04     A           LDAA   #$4
00261A F110 BD F078   A           JSR    RDTEMP
00262A F113 20 18 F12D            BRA    NODIS1
00263A F115 86 80     A  BTDISP   LDAA   #$80
00264A F117 97 33     A           STAA   DISCTL
00265A F119 86 04     A           LDAA   #$4
00266A F11B BD F078   A           JSR    RDTEMP    GO READ VOLTAGE
00267A F11E 96 33     A  DRLOOP   LDAA   DISCTL    TEST ATOD BUSY
00268A F120 2A 08 F12A            BPL    CONTDR    B=NO
00269A F122 CE 0044   A           LDX    #DISREG
00270A F125 BD F74D   A           JSR    DISPLA    DISPLAY DATA
00271A F128 20 F4 F11E            BRA    DRLOOP
00272         F12A    A  CONTDR   EQU    *
00273A F12A BD F081   A           JSR    BCDNOW
00274                            *
00275                            *SUBTRACT CCSH-BATSH
00276                            *
00277A F12D 96 29     A  NODIS1   LDAA   CCSH+1    ACCA=CCSH, 3 AMPS/DIGIT
00278                            * ACCB=BATSH, 3 AMPS/DIGIT              *
```

```
00279A F12F 10                         SBA             ACCA=ACCA-ACCB=CCSH-BATSH=ERROR
00280A F130 81 03     A                CMPA    #$03
00281A F132 2A 05 F139                 BPL     BEZAB    BR IF ERR>3
00282A F134 81 FD     A                CMPA    #-3
00283A F136 2B 01 F139                 BMI     BEZAB    BR IF ERR<-
00284A F138 4F                         CLRA             ACCA=0;  NO CHANGE
00285A F139 D6 36     A BEZAB          LDAB    RELNUM   ACCB=RELNUM
00286A F13B 1B                         ABA              ACCA=RELNUM+ERROR
00287A F13C 2A 02 F140                 BPL     BRLDOK   BR IF RESULT POSITIVE (OK)
00288A F13E 86 7F                      LDAA    #$7F     ACCA=$7F IF RESULT NEGATIVE, FULL LOAD
00289          F140  A BRLDOK EQU      *
00290A F140 BD F8D5  A                 JSR     RELAY    UPDATE LOAD RELAYS
00291A F143 8D 1E F163                 BSR     DISBTV
00292A F145 D0 14    A                 SUBB    ETMPH+1  COMPARE TO TEMP COMPENSATED VALUE
00293A F147 92 13    A                 SBCA    ETMPH
00294A F149 2B 5C F1A7                 BMI     BATLS8   B=BATV<ETMPH
00295A F14B 7A 002D  A BATXX           DEC     BATCTR   T=20 SEC?
00296A F14E 26 B8 F108                 BNE     BATLUP
00297A F150 CE 0008  A BTGOOD          LDX     #$0008   GOOD LAMP ON
00298A F153 8D 7C F1D1 CHARLI          BSR     LAMPSO
00299                          *
00300A F155 CE F084  A BTLTOF          LDX     #$F084   KW TEST IN PROGRESS OFF
00301A F158 8D 77 F1D1                 BSR     LAMPSO   AND TEST IN PROGRESS OFF
00302                          *
00303A F15A 4F           BTDONE        CLRA             UNLOAD
00304A F15B 97 37    A                 STAA    RELKA
00305A F15D BD F8D5  A                 JSR     RELAY    BATTERY
00306A F160 7E F65D  A                 JMP     PCLEAR   SCAN PUSHBUTTONS
00307                          *
00308A F163 96 88    A DISBTV          LDAA    PIA3AD
00309A F165 85 08    A                 BITA    #$08
00310A F167 26 06 F16F                 BNE     DISBVO
00311A F169 BD F4EB  A                 JSR     WATQTR
00312A F16C 7E F468  A                 JMP     RDBATV
00313A F16F 86 0C    A DISBVO          LDAA    #$C      DELAY FOR 250 MS.
00314A F171 97 49    A                 STAA    IXH1
00315A F173 86 80    A                 LDAA    #$80     SET DISPLAY IN PROGRESS
00316A F175 97 33    A                 STAA    DISCTL
00317                          *
00318A F177 BD F468  A                 JSR     RDBATV   X=BATV IN HEX
00319A F17A 96 33    A DRNLOP          LDAA    DISCTL   TEST ATOD BUSY
00320A F17C 2A 10 F18E                 BPL     NBUSY2
00321A F17E CE 0044  A                 LDX     #DISREG
00322A F181 BD F74D  A                 JSR     DISPLA
00323A F184 7A 0049  A                 DEC     IXH1
00324A F187 26 F1 F17A                 BNE     DRNLOP
00325A F189 7C 0049  A                 INC     IXH1
00326A F18C 20 EC F17A                 BRA     DRNLOP
00327A F18E DE 02    A NBUSY2          LDX     ATODD
00328A F190 DF 44    A                 STX     DISREG
00329A F192 DE 04    A                 LDX     ATODD+2
00330A F194 DF 46    A                 STX     DISREG+2
00331A F196 CE 0044  A DRNLP1          LDX     #DISREG
00332A F199 BD F74D  A                 JSR     DISPLA
00333A F19C 7A 0049  A                 DEC     IXH1
00334A F19F 26 F5 F196                 BNE     DRNLP1
00335A F1A1 CE 0002  A                 LDX     #ATODD
00336A F1A4 7E F081  A                 JMP     BCDNOW
00337                          *
00338                          *LOW BATTERY VOLTAGE ROUTINES
00339                          *
00340A F1A7 96 2E    A BATLS8          LDAA    BCNSTR   CHECK TEST MODE
00341A F1A9 26 1F F1CA                 BNE     BATBBN   BR IF IN RETEST MODE
00342A F1AB CE 0002  A                 LDX     #$0002   LOW VOLTAGE ON
00343A F1AE 8D 21 F1D1                 BSR     LAMPSO
00344                          *
00345A F1B0 CE F004  A                 LDX     #$F004   KW TEST IN PROGRESS OFF
00346A F1B3 8D 1C F1D1                 BSR     LAMPSO
00347                          *
00348A F1B5 4F                         CLRA             UNLOAD
00349A F1B6 BD F8D5  A                 JSR     RELAY    BATTERY
00350                          *
00351                          *CHECK BOUNCE BACK VOLTAGE
00352                          *
00353A F1B9 86 35    A                 LDAA    #$35     COUNTER FOR 15 SEC.
00354A F1BB 97 2D    A                 STAA    BATCTR
00355A F1BD 8D A4 F163 EBLOOP          BSR     DISBTV
00356A F1BF 7A 002D  A                 DEC     BATCTR
00357A F1C2 26 F9 F1BD                 BNE     EBLOOP
00358                          * REG A HAS HI BATV, REG B HAS LO BATV
00359A F1C4 D0 16    A                 SUBB    EBTMPH+1 ACCB=LO(E-EBB)
00360A F1C6 92 15    A                 SBCA    EBTMPH   ACCA=HI(E-EBB)
00361A F1C8 2D 0A F1D4                 BLT     BATCON   BR IF E<EBB
00362                          *
00363                          * BAD BATTERY
00364                          *
```

```
00365A F1CA CE 0010  A BATBBN LDX    #$0010     BAD LAMP ON
00366A F1CD 8D 02 F1D1       BSR    LAMPSO
00367A F1CF 20 84 F155       BRA    BTLTOF
00368A F1D1 7E F7C9  A LAMPSO JMP   LAMPS
00369                        *
00370                        * CONDUCTANCE TEST
00371                        *
00372A F1D4 4F        BATCON CLRA
00373A F1D5 97 22    A        STAA  BATVL      CLEAR BATVL
00374A F1D7 97 23    A        STAA  BATVL+1
00375A F1D9 DE 28    A        LDX   CCSH       CCSH=0.XXX
00376A F1DB 4F                CLRA             CCSH X 1.30
00377A F1DC C6 82    A        LDAB  #$82
00378A F1DE BD F284  A        JSR   MULT       =.XXXXX
00379A F1E1 CE 004D  A        LDX   #DIVEND
00380A F1E4 4F                CLRA             DIV. BY 10
00381A F1E5 C6 0A    A        LDAB  #10
00382A F1E7 BD F2AD  A        JSR   DIVIDE     ANSWER WILL =0.XXXX
00383A F1EA 96 54    A        LDAA  RESULT     ADD .8700
00384A F1EC D6 55    A        LDAB  RESULT+1
00385A F1EE CB FC    A        ADDB  #$FC
00386A F1F0 89 20    A        ADCA  #$20
00387A F1F2 97 4E    A        STAA  MULCND
00388A F1F4 D7 4F    A        STAB  MULCND+1
00389A F1F6 DE 4E    A        LDX   MULCND     ((CCSH*1.30)+.870)=X.XXXX
00390A F1F8 96 13    A        LDAA  ETMPH      ETEMPH= XX.XX
00391A F1FA D6 14    A        LDAB  ETMPH+1
00392A F1FC CB 46    A        ADDB  #70        ADD .7 TO ERFTEMP
00393A F1FE 89 00    A        ADCA  #0
00394A F200 BD F284  A        JSR   MULT       (((.870+CCSH*1.30))*(ERFTMP+.7)
00395A F203 CE 004D  A        LDX   #DIVEND    ANSWER WILL=XX.XXXXXX
00396A F206 86 27    A        LDAA  #$27       DIVIDE BY 10000
00397A F208 C6 10    A        LDAB  #$10
00398A F20A BD F2AD  A        JSR   DIVIDE
00399A F20D DF 24    A        STX   BATVTC     (.870+(CCSH*1.30)(ERFTEMP+.7))=XX.XX
00400A F20F 86 10    A        LDAA  #$10       TURN ON RELAY KL
00401A F211 97 37    A        STAA  RELKA
00402A F213 4F                CLRA
00403A F214 BD F8D5  A        JSR   RELAY
00404A F217 86 11    A        LDAA  #$11       5 SEC.
00405A F219 97 2D    A        STAA  BATCTR
00406A F21B BD F163  A CONLP1 JSR   DISBTV
00407A F21E 7A 002D  A        DEC   BATCTR
00408A F221 26 F8 F21B        BNE   CONLP1     B=5 SEC. NOT UP
00409A F223 86 09    A        LDAA  #$9        10 SEC.
00410A F225 8D 23 F24A        BSR   CONTST
00411A F227 CE 0020  A        LDX   #$0020
00412A F22A 96 26    A        LDAA  BATVA
00413A F22C D6 27    A        LDAB  BATVA+1
00414A F22E D0 25    A        SUBB  BATVTC+1
00415A F230 92 24    A        SBCA  BATVTC
00416A F232 2A 07 F23B        BPL   GRECRG     B=GOOD RECHARGE
00417A F234 86 05    A        LDAA  #$5        5 SEC.
00418A F236 8D 12 F24A        BSR   CONTST
00419A F238 CE 0040  A        LDX   #$40       RECRG RETEST
00420A F23B 7E F153  A GRECRG JMP   CHARLI
00421                        *
00422                        *
00423        F23E    A LPONOF EQU    *
00424A F23E BD F7C9  A        JSR   LAMPS
00425A F241 CE 1162  A        LDX   #04450     WAIT FOR 5 SEC.
00426A F244 BD F8E7  A        JSR   WAITFO
00427A F247 7E F658  A        JMP   LMPSOF     TURN ALL LAMPS OFF
00428                        *
00429                        *
00430A F24A 97 00    A CONTST STAA  LINDEL
00431A F24C 86 03    A CONLP3 LDAA  #$3        1 SEC.
00432A F24E 97 2D    A        STAA  BATCTR
00433A F250 BD F163  A        JSR   DISBTV
00434A F253 DF 26    A        STX   BATVA      STORE BATV IN BATVA
00435A F255 BD F163  A CONLP2 JSR   DISBTV     WAIT ONE SEC.
00436A F258 7A 002D  A        DEC   BATCTR
00437A F25B 26 F8 F255        BNE   CONLP2
00438A F25D D0 27    A        SUBB  BATVA+1    IS BATV>BATVA
00439A F25F 92 26    A        SBCA  BATVA
00440A F261 2B 1B F27E        BMI   STILOK     B=NO
00441A F263 DE 22    A        LDX   BATVL      IS BATVL CLEARED
00442A F265 26 04 F26B        BNE   TSTVL      B=NO
00443A F267 DE 26    A        LDX   BATVA
00444A F269 DF 22    A        STX   BATVL      STORE BATV AT BATVL
00445A F26B 96 0E    A TSTVL  LDAA  DATAH      BATV-.17 VOLTS
00446A F26D D6 0F    A        LDAB  DATAH+1
00447A F26F C0 11    A        SUBB  #17
00448A F271 82 00    A        SBCA  #0
00449A F273 D0 23    A        SUBB  BATVL+1    IS (BATV-.17)>BATVL
00450A F275 92 22    A        SBCA  BATVL
```

```
00451A F277 2B 05 F27E        BMI    STILOK     B=NO
00452A F279 31                INS               CLEAN STACK
00453A F27A 31                INS
00454A F27B 7E F1CA  A        JMP    BATBBN     GO TURN ON BAD LAMP
00455        F27E  A STILOK   EQU    *
00456A F27E 7A 0000  A        DEC    LINDEL
00457A F281 26 C9 F24C        BNE    CONLP3
00458A F283 39                RTS
00459                         TTL    DOUBLE PRECISION BINARY MULTIPLICATION
00460                         NAM    MULT
```

MULT    DOUBLE PRECISION BINARY MULTIPLICATION

```
00462                *
00463                *              REG-B 2ND BYTE
00464                * DOUBLE PRECISION UNSIGNED BINARY MULTIPLICATION
00465                *
00466                * MULCND * MULPYR = PRODUCT (A,B,MULPYR)
00467                * REG-A,B * REG-X
00468                * PRODUCT = REG-A MOST SIGNIFICANT BYTE
00469                *           REG-B  2ND BYTE
00470                *           MULPYR 3RD BYTE
00471                *           MULPYR+1 LEAST SIGNIFICANT BYTE
00472                *
00473                *
00474A F284 DF 50   A MULT     STX    MULPYR     OSAVE MULTIPLIER
00475A F286 D7 4F   A          STAB   MULCND+1   SAVE MULTIPLICAND
00476A F288 97 4E   A          STAA   MULCND
00477A F28A CE 004E A          LDX    #MULCND    POINT TO DATA
00478A F28D 86 10   A          LDAA   #16        NUMBER OF BITS
00479A F28F 97 48   A          STAA   CTR
00480A F291 4F                 CLRA
00481A F292 5F                 CLRB
00482A F293 66 02   A          ROR    2,X        MULPYR
00483A F295 66 03   A          ROR    3,X        MULPYR+1
00484A F297 24 04 F29D MULLP   BCC    SHIFT      B=BY 0 THIS TIME
00485A F299 EB 01   A          ADDB   1,X        MULCND+1
00486A F29B A9 00   A          ADCA   0,X        MULCND
00487A F29D 46          SHIFT  RORA              SHIFT PARTIAL PRODUCT
00488A F29E 56                 RORB
00489A F29F 66 02   A          ROR    2,X
00490A F2A1 66 03   A          ROR    3,X
00491A F2A3 7A 0048 A          DEC    CTR
00492A F2A6 26 EF F297         BNE    MULLP      B=MORE
00493A F2A8 97 4E   A          STAA   MULCND
00494A F2AA D7 4F   A          STAB   MULCND+1
00495A F2AC 39                 RTS
00496                          TTL    32 X 16 BIT UNSIGNED BINARY DIVIDE
00497                          NAM    DIVIDE
```

DIVIDE 32 X 16 BIT UNSIGNED BINARY DIVIDE

```
00499                * 32 BIT BY 16 BIT UNSIGNED BINARY DIVIDE.
00500                * ENTRY:   REG A,B=DIVISOR
00501                *          REG X POINTS TO DIVIDEND=4 BYTES
00502                * EXIT:    RESULT=16 BIT PRODUCT
00503                *          REGX=RESULT
00504                *
00505                *
00506        F2AD  A DIVIDE EQU   *
00507A F2AD 37                 PSHB
00508A F2AE 5F                 CLRB
00509A F2AF E7 00   A          STAB   0,X        CLEAR MS BIT
00510A F2B1 D7 54   A          STAB   RESULT
00511A F2B3 D7 55   A          STAB   RESULT+1
00512A F2B5 C6 11   A          LDAB   #17
00513A F2B7 D7 48   A          STAB   CTR
00514A F2B9 33                 PULB
00515A F2BA 4D                 TSTA
00516A F2BB 2B 07 F2C4         BMI    LJUST      B=LEFT JUSTIFIED
00517A F2BD 7C 0048 A SHIFTL   INC    CTR
00518A F2C0 58                 ASLB
00519A F2C1 49                 ROLA
00520A F2C2 2A F9 F2BD         BPL    SHIFTL
00521A F2C4 D7 53   A LJUST    STAB   DIVSOR+1   SAVE DIVISOR
00522A F2C6 97 52   A          STAA   DIVSOR
00523A F2C8 A6 01   A DIV0     LDAA   1,X
00524A F2CA E6 02   A          LDAB   2,X
00525A F2CC D0 53   A          SUBB   DIVSOR+1
00526A F2CE 92 52   A          SBCA   DIVSOR
00527A F2D0 36                 PSHA              SAVE MOST SIGNIFICANT BYTE
00528A F2D1 A6 00   A          LDAA   0,X        LOAD LAST CARRY BIT
00529A F2D3 82 00   A          SBCA   #0         TAKE IT IN TO ACCOUNT
00530A F2D5 32                 PULA              MSB BACK
00531A F2D6 27 02 F2DA         BEQ    HOP
00532A F2D8 23 1F F2F9         BLS    TOOBIG
00533        F2DA  A HOP       EQU    *
```

```
00534A F2DA 6F 00     A              CLR    0,X        RESET MOST SIGNF. BIT
00535A F2DC E7 02     A              STAB   2,X
00536A F2DE A7 01     A              STAA   1,X
00537A F2E0 0D                       SEC
00538A F2E1 79 0055   A  DIV1        ROL    RESULT+1
00539A F2E4 79 0054   A              ROL    RESULT
00540A F2E7 68 04     A              ASL    4,X
00541A F2E9 69 03     A              ROL    3,X
00542A F2EB 69 02     A              ROL    2,X
00543A F2ED 69 01     A              ROL    1,X
00544A F2EF 69 00     A              ROL    0,X        SAVE MOST SIGNIFICANT BIT
00545A F2F1 7A 0048   A              DEC    CTR
00546A F2F4 26 D2 F2C8               BNE    DIV0
00547A F2F6 DE 54     A              LDX    RESULT
00548A F2F8 39                       RTS
00549A F2F9 0C           TOOBIG      CLC
00550A F2FA 20 E5 F2E1               BRA    DIV1
00551                                TTL    STARTER CURRENT TEST

RDBATV READ BATTERY VOLTAGE

00841                     *          SUBROUTINE RDBATV
00842                     *THIS SUBROUTINE READS BATV AND STORES THE VOLTAGE IN
00843                     *DATAH AND IN THE INDEX REGISTER IN HEXADECIMAL
00844                     *
00845                     *
00846A F468 86 01     A  RDBATV LDAA  #01       SELECT
00847A F46A 7E F078   A              JMP    RDTEMP     READ TEMP,AND RETURN DIRECTLY TO CALLER
00848                                TTL    VOLTAGE REGULATOR TEST
00849                                NAM    VLTEST

HEXBCD HEXIDECIAML TO BCD CONVERSION

00965                     * ENTRY: A = HI ORDER BYTE
00966                     *        B = LO ORDER BYTE
00967                     *        X = POINTER TO TABLE WHERE UNPACKED BCD IS TO BE STORED
00968                     *
00969                     * EXIT: ALL REGISERS DESTROYED
00970                     *
00971          F4F1    A  HEXBCD EQU  *
00972A F4F1 DF 07     A              STX    IXH        SAVE X
00973A F4F3 4D                       TSTA              IS HEX NEGATIVE?
00974A F4F4 2A 09 F4FF               BPL    POSHEX     B=NO
00975A F4F6 50                       NEGB              COMPLIMENT HEX
00976A F4F7 89 00     A              ADCA   #0
00977A F4F9 40                       NEGA
00978A F4FA 36                       PSHA              SAVE A
00979A F4FB 86 80     A              LDAA   #$80       FLAG NEGATIVE
00980A F4FD 20 02 F501               BRA    CONTUE     CONTINUE
00981          F4FF    A  POSHEX EQU  *
00982A F4FF 36                       PSHA              SAVE A
00983A F500 4F                       CLRA              SET POSITIVE
00984A F501 97 0D     A  CONTUE STAA  BCDNEG    SET SIGN
00985A F503 86 04     A              LDAA   #4         4 DIGITS
00986A F505 97 48     A              STAA   CTR
00987A F507 CE F539   A              LDX    #DECTAB    DECIMAL TABLE
00988A F50A 4F           NXTBCD CLRA                   RESET BCD DIGIT
00989A F50B 97 4C     A              STAA   BCDCTR
00990A F50D 32                       PULA              A BACK
00991A F50E E0 01     A  DECLOP SUBB  1,X        SUBTRACT NEXT BCD UNIT
00992A F510 A2 00     A              SBCA   0,X
00993A F512 2B 05 F519               BMI    TOMUCH     B=TOO MUCH
00994A F514 7C 004C   A              INC    BCDCTR     INC DIGIT
00995A F517 20 F5 F50E               BRA    DECLOP
00996          F519    A  TOMUCH EQU  *
00997A F519 EB 01     A              ADDB   1,X        ADD BACK
00998A F51B A9 00     A              ADCA   0,X
00999A F51D 36                       PSHA
01000A F51E 08                       INX               POINT TO NEXT
01001A F51F 08                       INX
01002A F520 DF 49     A              STX    IXH1       SAVE X POINTER
01003A F522 DE 07     A              LDX    IXH        DATA TABLE BACK
01004A F524 96 4C     A              LDAA   BCDCTR     BCD CHARACTER
01005A F526 9A 0D     A              ORAA   BCDNEG     OR IN SIGN
01006A F528 7F 000D   A              CLR    BCDNEG     RESET SIGN
01007A F52B A7 00     A              STAA   0,X        SAVE DIGIT
01008A F52D 08                       INX               POINT TO NEXT
01009A F52E DF 07     A              STX    IXH
01010A F530 DE 49     A              LDX    IXH1       DECTAB POINTER BACK
01011A F532 7A 0048   A              DEC    CTR        MORE TO DO?
01012A F535 26 D3 F50A               BNE    NXTBCD     B=YES
01013A F537 32                       PULA
01014A F538 39                       RTS               RETURN
01015                     *
01016          F539    A  DECTAB EQU  *
01017A F539 03E8     A              FDB    1000
01018A F53B 0064     A              FDB    100
01019A F53D 000A     A              FDB    10
01020A F53F 0001     A              FDB    1
01021                                TTL    ROLL DISPLAY DATA
01022                                NAM    ROLDSP
```

ONLINE DISPLAY ONLINE ATOD INPUT

```
01205                       *         SUBROUTINE ONLINE
01206                       *THIS SUBROUTINE DISPLAYS ONE OF THE ANALOG INPUTS (8) AS
01207                       *DICTATED BY THE NUMBER IN LINENO.  THIS INFORMATION IS
01208                       *TRANSFERRED TO ATOD THROUGH PBUT.  ONLINE RUNS CON-
01209                       *TINUOUSLY UNTIL A PUSHBUTTON IS PUSHED, A STOP, OR
01210           .           *POWER DOWN/UP.  USER MAY JMP OR JSR TO THIS ROUTINE.
01211                       *DECIMAL POINT IS STORED AT DECPT. SEE DISPLA.
01212                       *
01213                       *
01214           F633    A ONLINE EQU   *
01215A F633 97 01       A           STAA   ATODN     ATODN FOR ATOD SUBROUTINE
01216A F635 86 80       A NNN       LDAA   #$80      SET DISPLAY IN PROGRESS
01217A F637 97 33       A           STAA   DISCTL
01218A F639 BD F6A7     A           JSR    ATOD      GO GET DATA
01219           F63C    A BSYTST EQU *
01220A F63C 96 33       A           LDAA   DISCTL    ATOD BUSY?
01221A F63E 2A 08 F648              BPL    BUSY1     B=NO
01222A F640 CE 0044     A           LDX    #DISREG
01223A F643 BD F74D     A           JSR    DISPLA    DISPLAY DATA
01224A F646 20 F4 F63C              BRA    BSYTST
01225           F648    A BUSY1 EQU *
01226A F648 DE 02       A           LDX    ATODD     TRANSFER DATA
01227A F64A DF 44       A           STX    DISREG
01228A F64C DE 04       A           LDX    ATODD+2
01229A F64E DF 46       A           STX    DISREG+2
01230A F650 CE 0044     A           LDX    #DISREG
01231A F653 86 19       A           LDAA   #25       SET COUNTER SO THAT
01232A F655 97 00       A MMM       STAA   LINDEL
01233A F657 39                      RTS
01234                       *
```

```
01236                       *         SUBROUTINE LMPSOF
01237                       *THIS SUBROUTINE USES LAMPS TO TURN OFF ALL LAMPS
01238                       *
01239A F658 CE F0FF     A LMPSOF LDX   #$F0FF    ALL LAMPS OFF
01240A F65B 20 D3 F630              BRA    LAMPS3
01241                               TTL    PUSH BUTTON SCAN
01242                               NAM    PBUT
```

PBUT    PUSH BUTTON SCAN

```
01244                       *         PROGRAM PBUT
01245                       *THIS PROGRAM READS THE STATES OF ALL THE PUSHBUTTONS AND
01246                       *BRANCHES TO ONE OF EIGHT PROGRAMS IF ONE BUTTON IS HELD
01247                       *DOWN FOR 20MSEC AND RELEASED FOR 20MSEC, WITH NO BOUNCE.
01248                       *IT WILL BRANCH TO FAIL IF ANY OTHER COMBINATIONS ARE
01249                       *TRIED.  IF NO PUSHBUTTONS ARE PUSHED IT WILL JUMP TO
01250                       *DISPLA
01251                       * NAM PBUT1
01252A F65D CE 0000     A PCLEAR LDX   #0000     CLEAR INDEX REGISTER
01253A F660 DF 07       A PBUT   STX    IXH       SAVE X POINTER
01254A F662 D6 80       A PBUT1  LDAB   PIA1AD    STORE PIA DATA IN ACC B
01255A F664 C4 0F       A           ANDB   #$0F      AND OFF LEFT NIBBLE
01256A F666 27 2A F692              BEQ    GOSHOW    BRANCH TO DISPLA IF NO PB PSHD
01257A F668 CE 041D     A           LDX    #$041D    LDX FOR COUNT DOWN
01258A F66B 17            SCGT1     TBA    '         STORE OLD PIA OFF
01259A F66C 98 80       A           EORA   PIA1AD    SUBTRACT NEW PIA OFF
01260A F66E 84 0F       A           ANDA   #$0F      AND OFF LEFT NIBBLE
01261A F670 26 F0 F662              BNE    PBUT1     BRANCH IF NOT THE SAME
01262A F672 09                      DEX              COUNT OFF ONE
01263A F673 26 F6 F66B              BNE    SCGT1     BRANCH TO START CHG TST 1
01264A F675 C1 09       A           CMPB   #$9       ACCB<9
01265A F677 2A 19 F692              BPL    GOSHOW    B=BAD CODE
01266A F679 8E 007F     A           LDS    #$7F
01267A F67C CE F695     A           LDX    #PBTBL-2  STORE PBTBL ADDRESS IN X-2
01268A F67F 08            CTUP      INX              * INC X 2 FOR *
01269A F680 08                      INX              * EVERY DEC OF B *
01270A F681 5A                      DECB
01271A F682 26 FB F67F              BNE    CTUP      KEEP INDEXING UNTIL PB=0
01272A F684 7F 0037     A           CLR    RELKA     TURN ALL
01273A F687 4F                      CLRA             RELAYS
01274A F688 BD F8D5     A           JSR    RELAY     OFF
01275A F68B 7F 0057     A           CLR    KFLASH    ENABLE DISPLAY
01276A F68E EE 00       A           LDX    0,X       ADDRESS OF TEST
01277A F690 6E 00       A           JMP    0,X       JUMP THRU PBTBL
```

```
01278A F692 DE 07     A  GOSHOW  LDX    IXH       RESTORE X
01279A F694 7E F74D   A          JMP    DISPLA
01280                    *
01281                    *
01282                    *
01283A F697  F049    A  PBTBL  FDB    BATEST    BATTERY TEST
01284A F699  F30A    A         FDB    VEHTST    STRTST,ALTEST,VLTEST
01285A F69B  F043    A         FDB    RETEST    RETEST BATTERY
01286A F69D  F5C1    A         FDB    VOLTST    EXTERNAL VOLTMETER
01287A F69F  F37C    A         FDB    XFLTST    EXTERNAL FIELD TEST
01288A F6A1  F5D1    A         FDB    DRNTST    BATTERY DRAIN TEST
01289A F6A3  F5FE    A         FDB    ACKTST    ALTERNATOR CIRCUIT RESISTANCE TEST
01290A F6A5  F541    A         FDB    ROLDSP    STRDRW,ALTOUT,VLTREG
01291                    *
01292                    *
01293                    *
01294                           TTL    ANALOG TO DIGITAL CONVERTER
01295                           NAM    ATOD

ATOD    ANALOG TO DIGITAL CONVERTER

01297                    *            SUBROUTINE ATOD
01298                    *THIS ROUTINE READS DATA FROM PIA1BD AND STORES IT IN RAM
01299                    *AT ATODD WHICH IS THE MSD. ATODN DICTATES WHICH LINE TO
01300                    *SENSE (0TO7). ADDRESS OF MSD REMAINS IN THE INDEX REGISTER
01301                    *PIA DATA DIRECTION REGISTERS MUST BE PRESET
01302                    *BEFORE THIS PROGRAM.  SEE PBUT
01303                    *
01304                    *
01305         F6A7     A  ATOD   EQU    *
01306A F6A7 96 01     A         LDAA   ATODN     STORE LINE NUMBER IN ACCA
01307A F6A9 97 88     A         STAA   PIA3AD    PIA3 PR=LINE #(00T007)
01308A F6AB C6 04     A         LDAB   #$04
01309A F6AD D7 34     A         STAB   ADIRQ     USE ADIRQ AS COUNTER(0100)
01310A F6AF D6 82     A         LDAB   PIA1BD    READ PIA TO CLEAR INTRPT
01311A F6B1 C6 37     A         LDAB   #$37      SET UP PIA FOR CB2=DU=0 AND
01312A F6B3 0E                  CLI              FOR CB1 TO BE SENSING INTERRUPT
01313A F6B4 D7 83     A         STAB   PIA1BC    CRB=XX11 0111
01314A F6B6 7D 0033   A         TST    DISCTL
01315A F6B9 2B 04 F6BF          BMI    RETURN    B=DISPLAY IN PROGRESS
01316A F6BB 01             WAIT2 NOP
01317A F6BC 3E                  WAI              WAIT FOR INTERRUPT #1
01318A F6BD 20 FC F6BB          BRA    WAIT2
01319A F6BF 39             RETURN RTS            GO BACK TO MAIN

ATOD    ANALOG TO DIGITAL CONVERTER

01321                    *        INTERRUPT ROUTINE FOR ATOD
01322                    *UPON INTERRUPT THIS PROGRAM
01323                    *CIRCLES THRU THE A TO D HARDWARE
01324                    *THREE TIMES;
01325                    *1 SYNCHRONIZES INTERRUPT
01326                    *2 GETS SIGN CORRECT
01327                    *3 READS AND STORES DATA
01328                    *
01329A F6C0 CE 0002   A  BGINT  LDX    #ATODD    BUFFER ADDRESS
01330A F6C3 86 3F     A         LDAA   #$3F      SET UP PIA FOR CB2=DU=1
01331A F6C5 97 83     A         STAA   PIA1BC    CRB=XX11 1111
01332A F6C7 74 0034   A         LSR    ADIRQ     MOVE COUNTER OVER 1
01333A F6CA 25 0D F6D9          BCS    NOSYNC    BRA OUT FIRST 2 TIMES
01334A F6CC 96 82     A         LDAA   PIA1BD    CLEAR IRQ
01335A F6CE D6 34     A         LDAB   ADIRQ     FIRST TIME THROUGH
01336A F6D0 C5 02     A         BITB   #2
01337A F6D2 27 04 F6D8          BEQ    NOTFST    B=NOT FIRST
01338A F6D4 C6 37     A         LDAB   #$37
01339A F6D6 D7 83     A         STAB   PIA1BC
01340A F6D8 3B             NOTFST RTI
01341A F6D9 86 34     A  NOSYNC LDAA   #$34      *SET UP PIA FOR CB2=DU=0
01342                    *                       AND DISABLE INTERRUPT
01343A F6DB 97 83     A         STAA   PIA1BC    *CRB=XX11 0100
01344A F6DD 86 10     A         LDAA   #$10      USE ADIRQ AS DIGIT
01345A F6DF 97 34     A         STAA   ADIRQ     *SELECT POINTER
01346A F6E1 96 82     A  RDMORE LDAA   PIA1BD    READ DATA AND STORE
01347A F6E3 95 34     A         BITA   ADIRQ     IS THIS THE ONE?
01348A F6E5 27 FA F6E1          BEQ    RDMORE    IF NOT, WAIT FOR NEXT DIGIT
01349A F6E7 16                  TAB              GOT IT! AND PUT IT IN ACCB ALSO
01350A F6E8 84 0F     A         ANDA   #$0F      AND OFF DIGIT SELECT
01351A F6EA C5 10     A         BITB   #$10      IS THIS MSD?
01352A F6EC 26 24 F712          BNE    ORASR     GO TO OVERRANGE ROUTINE
01353A F6EE A7 00     A  STDATA STAA   0,X       STORE FINAL DATA AT X
01354A F6F0 08                  INX              ADVANCE TO NEXT DIGIT
01355A F6F1 78 0034   A         ASL    ADIRQ     MOVE POINTER
01356A F6F4 24 EB F6E1          BCC    RDMORE    GO THRU IF DONE
01357A F6F6 30                  TSX              STACK TO XREG
01358A F6F7 5F                  CLRB
01359A F6F8 7D 0033   A  IRQRET TST    DISCTL    WAS IT A QUICK RETURN
01360A F6FB 2B 12 F70F          BMI    CTLCLR    B=YES
```

```
01361A F6FD A6 00    A              LDAA   0,X          DO SEI DIRECT
01362A F6FF 8A 10    A              ORAA   #$10
01363A F701 A7 00    A              STAA   0,X
01364A F703 C6 05    A              LDAB   #5           MOVE STACK UP
01365A F705 A6 04    A  MOVLOP      LDAA   4,X          TO RETURN DIRECTLY
01366A F707 A7 06    A              STAA   6,X
01367A F709 09                      DEX
01368A F70A 5A                      DECB
01369A F70B 26 F8 F705              BNE    MOVLOP
01370A F70D 31                      INS                 CLEAN STACK
01371A F70E 31                      INS
01372A F70F D7 33    A  CTLCLR      STAB   DISCTL
01373A F711 3B                      RTI                 GO BACK TO ATOD
01374                       *
01375                       *
01376                               TTL    ATOD OVER RANGE TEST
01377                               NAM    ORASR

ORASR   ATOD OVER RANGE TEST

01379                       ***************************************************
01380                       *SUBPROGRAM ORASR. ONLY USED BY ATOD(ABOVE).
01381                       *
01382                       *
·01383                      *   BEFORE                AFTER (IF NOT OVERRANGE)
01384                       *   ORASR                 ORASR
01385                       *
01386                       *
01387                       *   ATODD                 ATODD
01388                       *
01389                       *   0000 Q3 Q2 Q1 Q0      Q2 0 0 0  0 0 0 Q3
01390                       *
01391A F712 16          ORASR  TAB                PUT ATODD INTO ACCB ALSO
01392A F713 C4 0B    A         ANDB   #$0B        LOOK AT OVERRANGE BIT ONLY
01393A F715 C1 03    A         CMPB   #$03        COMPARE OVRNG BIT AND 1K BIT
01394A F717 27 13 F72C         BEQ    FAIL        IF Q0=1 AND Q1=1 AND Q3=0, BRANCH
01395A F719 7F 004B  A         CLR    TEMPER
01396A F71C 5F                 CLRB               ACCB=00
01397A F71D 85 04    A         BITA   #$04        LOOK AT SIGN BIT ONLY
01398A F71F 26 02 F723         BNE    POSY        BRANCH OUT IF POSITIVE
01399A F721 C6 80    A         LDAB   #$80        SET SIGN BIT IF NEGATIVE
01400A F723 43          POSY   COMA               FLIPOVER SINCE Q3=NOT 1K
01401A F724 84 08    A         ANDA   #$08        LOOK AT MAGNITUDE ONLY
01402A F726 47                 ASRA               B2=Q3N
01403A F727 47                 ASRA               B1=Q3N
01404A F728 47                 ASRA               B0=Q3N
01405A F729 1B                 ABA              A ACCA=ACCA+ACCB
01406A F72A 20 C2 F6EE         BRA    STDATA

01408                       ***************************************************
01409                       *·
01410                       *         SUBPROGRAM FAIL
01411                       *THIS PROGRAM DISPLAYS 1999 ON THE 3 1/2
01412                       *DIGIT DISPLAY LOCATED ON THE CONTROL PANEL. IT JUMPS
01413                       *TO SUBROUTINE DISPLA.
01414                       *THE ROUTINE WILL FLASH THE 19.99
01415                       *AND RETURN TO THE MAIN LINE PROGRAM
01416                       *
01417            F72C    A  FAIL    EQU    *
01418A F72C 96 01    A              LDAA   ATODN
01419A F72E 27 C8 F6F8              BEQ    IRQRET
01420            F730    A  FAILNT  EQU    *
01421A F730 CE 0109  A              LDX    #$109       LOAD 1999 FOR FAILURE
01422A F733 DF 02    A              STX    ATODD
01423A F735 CE 0909  A              LDX    #$909
01424A F738 DF 04    A              STX    ATODD+2
01425A F73A CE 0002  A  FAIL1       LDX    #ATODD      POINT TO DATA
01426A F73D 86 12    A              LDAA   #$12        SET .25 SEC.
01427A F73F 97 00    A              STAA   LINDEL
01428A F741 8D 0A F74D  FALLOP BSR   DISPLA
01429A F743 7A 0000  A              DEC    LINDEL
01430A F746 26 F9 F741              BNE    FALLOP      B=MORE
01431A F748 BD F4EB  A              JSR    WATQTR
01432A F74B 20 AB F6F8              BRA    IRQRET
01433                               TTL    3 1/2 DIGIT DISPLAY HANDLER
01434                               NAM    DISPLA
```

DISPLA 3 1/2 DIGIT DISPLAY HANDLER

```
01436                 *       SUBROUTINE DISPLA
01437                 *THIS ROUTINE DISPLAYS 3 1/2 DIGITS OF BCD WHICH ARE
01438                 *IN 4 BYTES OF MEMORY LOCATED AT THE ADDRESS STORED IN
01439                 *THE INDEX REGISTER. THE NUMBER IS DISPLAYED ON THE
01440                 *3 1/2 DIGIT SEVEN SEGMENT READOUT THROUGH PIAS #2
01441                 *AND #3. THE 4 DIGIT NUMBER IS DISPLAYED FOR A PERIOD
01442                 *OF 80 MSEC. CONTROL IS THEN RETURNED TO THE MAIN
01443                 *PROGRAM. ROUTINES WISHING TO DISPLA SHOULD BRANCH (BSR)
01444                 *TO PBUT ,SINCE PBUT BRANCHES TO DISPLA IF NO BUTTONS
01445                 *ARE PUSHED.
01446                 *
01447                 *DECIMAL POINT SELECT IS AS FOLLOWS*
01448                 *X.XXX  DECPT=$20
01449                 *XX.XX  DECPT=$40
01450                 *XXX.X  DECPT=$80
01451                 *
01452                 *
01453                 *
01454                 *
01455A F74D 8C 0000  A DISPLA CPX    #0         IF COMING FROM PBUT AND NO DISPLAY,
01456A F750 26 26 F778        BNE    GOTHRU     IF X=0 GO TO PBUT
01457A F752 7D 0057  A        TST    KFLASH
01458A F755 26 4E F7A5        BNE    RETAGN
01459A F757 7F 0088  A        CLR    PIA3AD     AFTER BLANKING DISPLAY
01460A F75A BD F468  A        JSR    RDBATV     READ BATTERY VOLTAGE
01461A F75D 4D               TSTA              SEE IF MINUS
01462A F75E 2B 08 F768        BMI    LSBMIN     NEG. VOLTAGE
01463A F760 26 10 F772        BNE    BACKO      BLOCK MUST BE CONNECTED TO BATTERY
01464A F762 C1 02    A        CMPB   #2         SEE IF >2
01465A F764 2C 0C F772        BGE    BACKO      BLOCK CONNECTED TO BATTERY
01466A F766 20 04 F76C        BRA    REDAMB     <2 READ AMBIENT TEMPERATURE
01467A F768 C1 FE    A LSBMIN CMPB   #-2        >-2
01468A F76A 25 06 F772        BCS    BACKO      BLOCK CONNECTED TO BATTERY
01469        F76C    A REDAMB EQU    *
01470A F76C 4F                CLRA              READ TEMPERATURE
01471A F76D BD F078  A        JSR    RDTEMP
01472A F770 DF 5A    A        STX    AMBMV
01473A F772 CE 0000  A BACKO  LDX    #0         CLR X REG FOR PBUT
01474A F775 7E F660  A BACK   JMP    PBUT
01475                 *
01476                 *
01477A F778 A6 00    A GOTHRU LDAA   0,X        LOAD THE MSD AT ADD(X)
01478A F77A DF 07    A        STX    IXH        STORE THE DATA ADDRESS
01479                 *
01480                 *
01481                 *GENERATE THE 7 SEGMENT NUMBER FOR MSD
01482                 *MSD=S000 000D; S=1=NEGATIVE;  D=1=ONE VOLT
01483                 *
01484                 *
01485                 *                                    08= -    0000 1000
01486                 *                                    00=BLNK  0000 0000
01487                 *                                    0E= -1   0000 1110
01488                 *                                    06=  1   0000 0110
01489                 *
01490A F77C 16               TAB                ACCA=ACCB
01491A F77D 56               RORB               CARRY=D,  ACCB=0S00 0000
01492A F77E 49               ROLA               CARRY=S,  ACCA=0000 00DD
01493A F77F 48               ASLA               CARRY=0,  ACCA=0000 0DD0
01494A F780 57               ASRB               CARRY=0,  ACCB=00S0 0000
01495A F781 57               ASRB               CARRY=0,  ACCB=000S 0000
01496A F782 57               ASRB               CARRY=0,  ACCB=0000 S000
01497A F783 1B               ABA                ACCA=ACCA+ACCB =0000 SDD0
01498A F784 C6 10    A        LDAB   #$10       SET DS1=1
01499                 *
01500                 *
01501                 *LOAD PIAS AND TURN ON DIGIT SELECT
01502                 *
01503A F786 97 86    A LDPIAS STAA   PIA2BD     LOAD 7 SEG DATA
01504A F788 D7 2C    A        STAB   PIASTO     STORE DIGIT SELECT IN PIASTO
01505A F78A D6 88    A        LDAB   PIA3AD     ACCB=OLD REGISTER=DDDD ????
01506A F78C C4 0F    A        ANDB   #$0F       ACCB=0000 ???? ; KEEP OLD ????
01507A F78E DA 2C    A        ORAB   PIASTO     ACCB=NNNN ???? ; NEW STUFF
01508A F790 D7 88    A        STAB   PIA3AD     DIGIT SELECT REGISTER UPDATED
01509                 *
01510                 *DO OTHER THREE DIGITS NOW
01511                 *
01512                 *
01513                 * 5MSEC DELAY ROUTINE
01514                 *
01515A F792 CE 0005  A        LDX    #00005
01516A F795 BD F8E7  A        JSR    WAITFO     WAIT 5 MSEC
01517                 *
01518                 *DISPLAY NEXT DIGIT
01519                 *
01520A F798 DE 07    A        LDX    IXH        X=ADDRESS OF BCD DATA
01521A F79A C4 F0    A        ANDB   #$F0       GET RID OF OTHER DATA
```

```
01522A F79C 58                  ASLB              ACCB = DIGIT SELECT
01523A F79D 26 07 F7A6          BNE      NEXT
01524A F79F 7F 0086  A          CLR      PIA2BD   TURN OFF ALL 7 SEGMENTS
01525A F7A2 09                  DEX
01526A F7A3 09                  DEX               PUT INDEX REGISTER BACK TO BEGINNING
01527A F7A4 09                  DEX
01528A F7A5 39         RETAGN   RTS
01529                  *
01530A F7A6 08         NEXT     INX               X=ADDRESS OF NEXT DIGIT
01531A F7A7 A6 00  A            LDAA     0,X      ACCA=BCD DIGIT
01532A F7A9 DF 07  A            STX      IXH      STORE ADDRESS OF DATA
01533                  *
01534A F7AB CE F7BF  A          LDX      #DSPLTB  PUT TABLE ADDRESS IN X
01535A F7AE 4D                  TSTA              A=0?
01536A F7AF 26 0A F7BB NXTDIG   BNE      NOTDIG   B=NO
01537A F7B1 D1 06  A            CMPB     DECPT    DECIMAL POINT HERE?
01538A F7B3 26 02 F7B7          BNE      NODEC    B=NO
01539A F7B5 86 80  A            LDAA     #$80     FLAG DECIMAL POINT
01540A F7B7 AA 00  A   NODEC    ORAA     0,X      OR WITH DATA
01541A F7B9 20 CB F786          BRA      LDPIAS
01542              F7BB A NOTDIG EQU     *
01543A F7BB 08                  INX               POINT TO NEXT CODE
01544A F7BC 4A                  DECA
01545A F7BD 20 F0 F7AF          BRA      NXTDIG   CHECK A =0 YET
01546                  *
01547                  *                0  1  2  3  4  5  6  7  8  9
01548A F7BF    3F  A DSPLTB FCB $3F,$06,$5B,$4F,$66,$6D,$7D,$07,$7F,$67
01549                  *DISPLAY TABLE TO CONVERT BCD TO 7 SEGMENT
01550                  *
01551                  *
01552                           TTL      LAMP DISPLAY ROUTINE
01553                           NAM      LAMPS

LAMPS  LAMP DISPLAY ROUTINE

01555                  *        SUBROUTINE LAMPS
01556                  *THIS PROGRAM DISPLAYS THE LAMP OR LAMPS AS DICTATED IN
01557                  *RAM AT LOCATIONS LMPCOL AND LMPROW. LMPCOL INDICATES
01558                  *THE COLUMN AND LMPROW INDICATES WHICH ROW. A LAMP OR
01559                  *LAMPS MAY BE EITHER TURNED ON OR OFF DEPENDING ON THE
01560                  *FIRST CHARACTER IN LMPCOL. AN F TURNS THE LAMP(S) OFF
01561                  *AND A 0 TURNS IT (THEM) ON. THE INDEX REGISTER IS STORED
01562                  *INTO LMPCOL, LMPROW RESPECTIVELY ON THE FIRST INSTRUCTION
01563                  *
01564                  *LMPROW * LMPCOL*   LAMP DESCRIPTION
01565                  *  FF       03      COLUMNS 1 AND 2, ALL ROWS ON
01566                  *  FF       00      COLUMN 3, ALL ROWS ON
01567                  *  FF       FX      ALL LAMPS OFF
01568                  *
01569                  *  01       #2      TEST IN PROGRESS
01570                  *  02       #2      STARTER DRAW TEST COMPLETE
01571                  *  04       #2      ALTERNATOR OUTPUT TEST COMPLETE
01572                  *  08       #2      VOLTAGE REGULATOR TEST COMPLETE
01573                  *  10       #2      LOW BATTERY VOLTAGE
01574                  *  20       #2      LOW ALTERNATOR CURRENT
01575                  *  40       #2      DIODE FAILURE
01576                  *  80       #2      EXTERNAL FIELD
01577                  *
01578                  *  08       #1      EXTERNAL VOLTMETER
01579                  *  10       #1      BATTERY DRAIN
01580                  *  20       #1      ALTERNATOR CIRCUIT RESISTANCE TEST
01581                  *
01582                  *  01       #0      REVERSE POLARITY
01583                  *  02       #0      LOW VOLTAGE
01584                  *  04       #0      KW TEST IN PROGRESS
01585                  *  08       #0      GOOD
01586                  *  10       #0      BAD
01587                  *  20       #0      GOOD RECHARGE
01588                  *  40       #0      RECHARGE RETEST
01589                  *  80       #0      TEST IN PROGRESS
01590                  *
01591                  * NOTE # DENOTES EITHER 'F' OR '0',FOR 'OFF' OR 'ON' ...
01592                  * #1 MEANS CA2=0, CB2=1
01593                  * #2 MEANS CA2=1, CB2=0
01594                  * #0 MEANS CA2=0, CB2=0
01595                  *                                    LMPCOL=X X X X  X X CA2 CB2
01596A F7C9 DF 09  A LAMPS  STX   LMPCOL    LMPCOL=AB; LMPROW=CD; X=ABCD
01597                  *
01598                  *
01599                  *ARRANGE NEW CA2,CB2 AND COMPARE WITH OLD CA2,CB2
01600                  *
01601A F7CB D6 09  A            LDAB     LMPCOL   ACCB=XXXX 00AB A=CA2,B=CB2
01602A F7CD 58                  ASLB              ACCB=XXXX 0AB0
01603A F7CE 58                  ASLB              ACCB=XXXX AB00
01604A F7CF 17                  TBA               ACCA=XXXX AB00
01605A F7D0 C4 08  A            ANDB     #$08     ACCB=0000 A000
```

```
01606A F7D2 48                    ASLA              ACCA=000A B000
01607A F7D3 84 08      A          ANDA   #$08       ACCA=0000 B000
01608A F7D5 97 0B      A          STAA   LMPST1     LMPST1=0000 B000
01609A F7D7 D7 0C      A          STAB   LMPST2     LMPST2=0000 A000
01610A F7D9 96 89      A          LDAA   PIA3AC     ACCA=XXXX DXXX
01611A F7DB 84 08      A          ANDA   #$08       ACCA=0000 D000
01612A F7DD 10                    SBA               ACCA=0000(D-A)000
01613A F7DE 27 20 F800            BEQ    SAMEA      CA2 SAME BRANCH
01614                       *
01615                       *SET UP CB2 AND ROWS
01616                       *
01617A F7E0 96 0B      A NOSAME  LDAA   LMPST1     ACCA=0000 B000
01618A F7E2 8B 34      A          ADDA   #$34       ACCA=0011 B100
01619A F7E4 97 8B      A          STAA   PIA3BC     SELECT PR AND SET CB2=B
01620                       *
01621                       *TEST FOR ON OR OFF
01622                       *
01623A F7E6 96 09      A          LDAA   LMPCOL     ACCA=COL DATA
01624A F7E8 84 F0      A          ANDA   #$F0
01625A F7EA 27 03 F7EF            BEQ    TURNON     IF 0, TURN ROW DATA "ON"
01626A F7EC 4F                    CLRA              TURN ALL OFF SINCE COLUMNS CHANGED
01627A F7ED 20 02 F7F1            BRA    TNSFRB
01628A F7EF 96 0A      A TURNON  LDAA   LMPROW     ACCA=ROW DATA
01629A F7F1 43           TNSFRB  COMA              INVERT FOR HARDWARE INVERTERS
01630A F7F2 97 8A      A          STAA   PIA3BD
01631                       *
01632                       *SET UP CA2
01633                       *
01634A F7F4 96 0C      A          LDAA   LMPST2     ACCA=0000 A000
01635A F7F6 D6 89      A          LDAB   PIA3AC     ACCB=PQRS TUVW
01636A F7F8 C4 C7      A          ANDB   #$C7       ACCB=PQ00 0UVW
01637A F7FA 1B                    ABA               ACCA=PQ00 AUVW
01638A F7FB 8A 30      A          ORAA   #$30       ACCA=PQ11 AUVW
01639A F7FD 97 89      A          STAA   PIA3AC     PIA3AC SET UP WITH CA2
01640A F7FF 39                    RTS
01641                       *
01642                       *CHECK OLD CB2 WITH NEW CB2
01643                       *
01644A F800 96 8B      A SAMEA   LDAA   PIA3BC     ACCA=XXXX DXXX
01645A F802 84 08      A          ANDA   #$08       ACCA=0000 D000
01646A F804 D6 0B      A          LDAB   LMPST1     ACCB=0000 B000
01647A F806 10                    SBA               ACCA=0000 (D-B)000
01648A F807 26 D7 F7E0            BNE    NOSAME
01649                       *
01650                       *CA2 AND CB2 HAVE NOT CHANGED. ADD NEW LAMPS TO OLD
01651                       *
01652A F809 96 0A      A          LDAA   LMPROW
01653A F80B D6 09      A          LDAB   LMPCOL
01654A F80D C4 F0      A          ANDB   #$F0       IF NOT "0" TURN OFF
01655A F80F 27 04 F815            BEQ    ADDIT
01656A F811 9A 8A      A          ORAA   PIA3BD     TURN OFF BITS IN LMPROW
01657A F813 20 05 F81A            BRA    PLXIT
01658A F815 D6 8A      A ADDIT   LDAB   PIA3BD     ACCB=OLD DATA
01659A F817 43                    COMA              INVERT FOR HARDWARE INVERTERS
01660A F818 94 8A      A          ANDA   PIA3BD     ACCA=(NOT OLD DATA).(NEW DATA)
01661A F81A 97 8A      A PLXIT   STAA   PIA3BD
01662A F81C 39                    RTS
01663                             TTL    BCD TO HEX CONVERSION
01664                             NAM    BCDTOH

BCDTOH BCD TO HEX CONVERSION

01666                       *   SUBROUTINE BCDTOH   THIS SUBROUTINE CHANGES THE
01667                       *DATA ADDRESSED BY THE INDEX REGISTER. THE 4 DIGIT BCD
01668                       *DATA IS CHANGED TO HEXADECIMAL AND STORED AT DATAH AND
01669                       *IN THE INDEX REGISTER.
01670                       * CALL WITH:
01671                       *     ADDRESS OF BCD CHARACTERS IN X
01672                       * RETURNS:
01673                       *    16 BIT BINARY RESULT IN X AND DATAH
01674                       * USES THE ALGORYTHM ((BCD4*10+BCD3)*10+BCD2)
01675                       *                    *10+BCD1
01676              F81D  A BCDTOH EQU    *
01677A F81D A6 00      A          LDAA   0,X        SAVE SIGN FOR LATER
01678A F81F 97 0D      A          STAA   BCDNEG
01679A F821 84 01      A          ANDA   #1         STRIP SIGN
01680A F823 A7 00      A          STAA   0,X
01681A F825 86 04      A          LDAA   #4         4 BCD DIGITS
01682A F827 97 48      A          STAA   CTR
01683A F829 4F                    CLRA
01684A F82A 5F                    CLRB
01685A F82B 58           BCDLOP  ASLB              V*2
01686A F82C 49                    ROLA
01687A F82D D7 0F      A          STAB   DATAH+1    SAVE V*2
01688A F82F 97 0E      A          STAA   DATAH
01689A F831 58                    ASLB              (V*2)*4=V*8
01690A F832 49                    ROLA
```

```
01691A F833 58                   ASLB
01692A F834 49                   ROLA
01693A F835 DB 0F    A           ADDB   DATAH+1    V*2+V*8=V*10
01694A F837 99 0E    A           ADCA   DATAH
01695A F839 EB 00    A           ADDB   0,X        ADD IN NEXT DIGIT
01696A F83B 89 00    A           ADCA   #0         PROPIGATE CARRY
01697A F83D 08                   INX               POINT TO NEXT
01698A F83E 7A 0048  A           DEC    CTR        ONE LESS TO DO
01699A F841 26 E8 F82B           BNE    BCDLOP     B=MORE
01700A F843 7D 000D  A           TST    BCDNEG     IS IT NEGATIVE
01701A F846 2A 04 F84C           BPL    PLUS       B=NO
01702A F848 50                   NEGB              2'S COMP THE RESULT
01703A F849 89 00    A           ADCA   #0
01704A F84B 40                   NEGA
01705        F84C    A PLUS      EQU    *
01706A F84C D7 0F    A           STAB   DATAH+1
01707A F84E 97 0E    A           STAA   DATAH
01708A F850 DE 0E    A           LDX    DATAH      RESULTS
01709A F852 39                   RTS
01710                            TTL    TEMP COMPENSATED REFERENCE VOLTAGE
01711                            NAM    ERFTMP

ERFTMP TEMP COMPENSATED REFERENCE VOLTAGE

01713                       *       SUBROUTINE ERFTMP
01714                       *THIS SUBROUTINE GENERATES A TEMPERATURE COMPENSATED
01715                       *REFERENCE VOLTAGE BASED ON THE NUMBER IN THE INDEX
01716                       *REGISTER, WHICH IS THE TEMPERATURE IN HEX.  ETMPH
01717                       *CONTAINS THE VOLTAGE IN HEX AFTER EXECUTION.
01718                       *
01719                       *
01720A F853    73    A TMPTBL FCB   $73,$7,$9B,$9,$AF,$B,$C3,$F
01721A F85B    D3    A        FCB   $D3,$15,$DD,$1A,$FB,$1D,$FA
01722                       . *
01723                         *
01724        F862    A ERFTMP EQU   *
01725A F862 CE F853  A           LDX    #TMPTBL
01726A F865 DF 11    A           STX    NCTH       PUT ADDRESS AT NCT
01727A F867 C6 07    A           LDAB   #7         INCREASE X VALUE BY 1994
01728A F869 86 CA    A           LDAA   #$CA
01729A F86B 9B 18    A           ADDA   TEMPHX+1   TEMP DATA
01730A F86D D9 17    A           ADCB   TEMPHX
01731A F86F 97 08    A           STAA   IXH+1      SAVE IT FOR THE X REG.
01732A F871 D7 07    A           STAB   IXH
01733                         *
01734A F873 C6 03    A           LDAB   #$03       LOAD B WITH 768
01735A F875 86 10    A           LDAA   #$10       LOAD A WITH 16 (TOTAL=784)
01736A F877 D7 13    A           STAB   ETMPH      MSD=768 IN STACK
01737A F879 C6 06    A           LDAB   #6         STORE FIRST SLOPE
01738A F87B D7 10    A STRT      STAB   STACK1     STORE SLOPE IN STACK
01739A F87D DE 07    A MORE      LDX    IXH        PUT TEMPERATURE BACK INTO X
01740A F87F D6 10    A           LDAB   STACK1     REINSTATE B=SLOPE
01741                         *
01742A F881 8C 0000  A SLPZ      CPX    #0
01743A F884 27 1C F8A2           BEQ    DONE       GET OUT IF X=0; ALL DONE
01744A F886 09                   DEX
01745A F887 5A                   DECB              COUNT OFF SLOPE
01746A F888 26 F7 F881           BNE    SLPZ       KEEP DEC X UNTIL B=0
01747                         *
01748A F88A 4C                   INCA              INCREASE VOLTS BY 10MV
01749A F88B 97 14    A           STAA   ETMPH+1    STORE VOLTAGE
01750A F88D 26 03 F892           BNE    SKIP       IF A=0,MUST ADD CARRY(256)
01751A F88F 7C 0013  A           INC    ETMPH      INCREASE VOLTS BY 256
01752A F892 DF 07    A SKIP      STX    IXH        STORE X WHILE CHANGING SLPE
01753A F894 DE 11    A           LDX    NCTH       X=NUMBER TO INDEX TABLE
01754A F896 A1 00    A           CMPA   0,X        COMPARE A (VOLTS) WITH NO IN TABLE
01755A F898 26 E3 F87D           BNE    MORE       CONTINUE AT SAME SLOPE IF
01756                         *            A(VOLTS) IS LESS THAN TBL
01757A F89A 08                   INX               ADVANCE TABLE
01758A F89B E6 00    A           LDAB   0,X        PUT NEW SLOPE INTO ACC B
01759A F89D 08                   INX               BY 2
01760A F89E DF 11    A           STX    NCTH       REMEMBER NEW INDEX NUMBER
01761A F8A0 20 D9 F87B           BRA    STRT
01762                         *
01763A F8A2 DE 13    A DONE      LDX    ETMPH      PUT VOLTAGE IN  X
01764A F8A4 58                   ASLB              DOUBLE WHATS LEFT
01765A F8A5 D1 10    A           CMPB   STACK1     END IF 2B IS LESS
01766A F8A7 2E 01 F8AA           BGT    QUIT       THAN ORIGINAL SLOPE
01767A F8A9 08                   INX               INCREASE VOLTS FOR ROUNDING
01768         F8AA   A QUIT      EQU    *
01769A F8AA DF 13    A           STX    ETMPH
01770                         * CURVE COMPENSATION
01771A F8AC 86 00    A           LDAA   #0         UPPER BYTE
01772A F8AE C6 19    A           LDAB   #25        LOWER BYTE
01773A F8B0 DB 14    A           ADDB   ETMPH+1
01774A F8B2 99 13    A           ADCA   ETMPH
01775A F8B4 D7 14    A           STAB   ETMPH+1
01776A F8B6 97 13    A           STAA   ETMPH
01777A F8B8 39                   RTS
```

ERFTMP TEMP COMPENSATED REFERENCE VOLTAGE

```
01779                           TTL    BOUNCE BACK TEMPERATURE
01780                           NAM    EBBTMP

EBBTMP BOUNCE BACK TEMPERATURE

01782                    *      SUBROUTINE EBBTMP
01783                    *THIS PROGRAM GENERATES THE BOUNCE BACK VOLTAGE FOR A
01784                    *GIVEN TEMPERATURE. ZERO DEGREES EQUALS -1.600 VOLTS.
01785                    *EIGHTY DEGREES EQUALS 0.000 VOLTS.
01786                    *FORMULA:      FOR -2016<T$
01787                    *              EBB=1172 + (1/32)(T+2016)
01788                    *THIS PROGRAM TAKES THE NUMBER IN THE INDEX REGISTER,
01789                    *WHICH IS THE TEMPERATURE IN HEX, AND GENERATES EBB,
01790                    *THE BATTERY BOUNCE BACK VOLTAGE. EBB IS IN
01791                    *EBTMPH.
01792                    *
01793                    *
01794          F8B9     A EBBTMP EQU    *
01795A F8B9 86 05        A        LDAA  #5        FIVE SHIFTS TO DIVIDE BY 32
01796A F8BB 97 48        A        STAA  CTR
01797A F8BD C6 07        A        LDAB  #7        T+2016
01798A F8BF 86 E0        A        LDAA  #$E0
01799A F8C1 9B 18        A        ADDA  TEMPHX+1
01800A F8C3 D9 17        A        ADCB  TEMPHX
01801A F8C5 57            EBTLOP ASRB            DIVIDE T+2016 BY 32
01802A F8C6 46                    RORA
01803A F8C7 7A 0048 A             DEC   CTR
01804A F8CA 26 F9 F8C5            BNE   EBTLOP   B=SHIFT AGAIN
01805                    * (T+2016)/32
01806A F8CC 8B 94        A        ADDA  #$94     ADD 1172
01807A F8CE C9 04        A        ADCB  #$4      EBB=1172+(T+2016)/32
01808A F8D0 D7 15        A        STAB  EBTMPH
01809A F8D2 97 16        A        STAA  EBTMPH+1
01810A F8D4 39                    RTS
01811                             TTL   RELAY LOAD HANDLER
01812                             NAM   RELAY

RELAY  RELAY LOAD HANDLER

01814                    *      SUBROUTINE RELAY
01815                    *THIS SUBROUTINE PULLS IN RELAYS K1 THRU K7 WHICH LOAD
01816                    *THE BATTERY IN 2.5 AMP STEPS. THE NUMBER CORRESPONDING
01817                    *TO THE STATES BELOW IS READ FROM RELNUM. THE STATE OF
01818                    *RELAY KA IS READ FROM RELKA.
01819                    *
01820                    *PA0=1  PULLS IN K1 LOAD=2.5AMPS
01821                    *PA1=1  PULLS IN K2 LOAD=5.0AMPS .        7F=317.5AMPS
01822                    *PA2=1  PULLS IN K3 LOAD=10AMPS
01823                    *PA3=1  PULLS IN K4 LOAD=20AMPS
01824                    *PA4=1  PULLS IN K5 LOAD=40AMPS
01825                    *PA5=1  PULLS IN K6 LOAD=80AMPS
01826                    *PA6=1  PULLS IN K7 LOAD=160AMPS
01827                    *PA7=1  PULLS IN RELAY KT
01828                    *RELKA=$08 PULLS IN RELAY KA (CA2=1)
01829                    *RELKA=$10 PULLS IN RELAY KL (CB2=2)
01830                    *
01831                    *NAM RELAY
01832          F8D5     A RELAY  EQU    *
01833A F8D5 C6 34        A        LDAB  #$34
01834A F8D7 DA 37        A        ORAB  RELKA
01835A F8D9 D7 85        A        STAB  PIA2AC   SET KA ON OR OFF
01836A F8DB D6 37        A        LDAB  RELKA
01837A F8DD 54                    LSRB
01838A F8DE CA 34        A        ORAB  #$34
01839A F8E0 D7 87        A        STAB  PIA2BC   SET KL ON OR OFF
01840A F8E2 97 36        A        STAA  RELNUM   ACCB=RELAY STATE
01841A F8E4 97 84        A        STAA  PIA2AD   PRA=RELNUM
01842A F8E6 39                    RTS

01844                    *
01845                    *
01846                    *      SUBROUTINE WAITFO
01847                    *THIS SUBROUTINE DELAYS FOR A TIME DICTATED BY THE VALUE
01848                    *STORED IN THE INDEX REGISTER. THE NUMBER IS IN MSEC.
01849                    *
01850A F8E7 86 A6        A WAITFO LDAA  #166
```

```
01851A F8E9 4A            WAIT1  DECA           2 MICRO
01852A F8EA 26 FD F8E9           BNE    WAIT1   4 MICRO
01853A F8EC 09                   DEX            X=X-1 EVERY MILLISECOND
01854A F8ED 26 F8 F8E7           BNE    WAITFO  BR UNTIL X=0
01855A F8EF 39                   RTS
01856                            TTL    ENGINE SPEED CALCULATOR
01857                            NAM    SPEED
                F.F.    OFFSET VOLTAGE CALCULATOR

02004                            TTL    OFFSET VOLTAGE CALCULATOR

F.F.    OFFSET VOLTAGE CALCULATOR

02006                     *
02007                     *
02008                     *
02009                     *
02010                     *
02011                     * IF AMBIENT TEMP.-POST TEMP.>2 THEN TEL=(TBL(B) - .735(TBL(A))/.37
02012                     * OTHERWISE TEL=(TBL(B) - .59(TBL(A))/.49
02013                     * TBL(A)=AMBEINT TEMPERATURE
02014                     * TBL(B)=POST TEMPERATURE
02015                     * 1 MV. INCREMENT ON A TO D = 1/20 DEG.
02016                     * 80 DEG.=0 VOLTS OUT
02017                     *
02018                     *
02019                     *
02020                     *
02021                     *
02022A F9B5 DE 58     A CALFF  LDX    POSTMV   GET BATTERY POST TEMP. IN MV.
02023A F9B7 DF 0E     A        STX    DATAH
02024A F9B9 BD FA7B   A        JSR    INIT
02025A F9BC DF 5C     A        STX    POSTTM   STORE TEMPERATURE IN HEX
02026A F9BE DE 5A     A        LDX    AMBMV    GET AMBIENT TEMPERATURE IN MV.
02027A F9C0 DF 0E     A        STX    DATAH
02028A F9C2 BD FA7B   A        JSR    INIT
02029A F9C5 DF 5E     A        STX    AMBTM    STORE ACTUAL TEMP IN HEX DEG.
02030                       * CHECK FOR (AMB. TEMP-POST TEMP.) <= 2
02031A F9C7 D6 5F     A        LDAB   AMBTM+1
02032A F9C9 96 5E     A        LDAA   AMBTM
02033A F9CB D0 5D     A        SUBB   POSTTM+1 SUB. BLOCK TEMP. ON BAT.
02034A F9CD 92 5C     A        SBCA   POSTTM
02035A F9CF 26 0A F9DB         BNE    CHKMOR
02036A F9D1 C1 01     A        CMPB   #1       IS TEMP GREATER THAN +1 ?
02037A F9D3 23 19 F9EE         BLS    TELECN   BR HERE IF YES
02038                       *
02039                       * CHECK FOR AMB.TEMP-POST TEMP>1<=4
02040                       *
02041A F9D5 C1 04     A        CMPB   #4
02042A F9D7 23 26 F9FF         BLS    TELECI
02043A F9D9 20 02 F9DD         BRA    TELECY   BR HERE IF NO
02044A F9DB 2B 11 F9EE  CHKMOR BMI    TELECN
02045A F9DD 96 5E     A TELECY LDAA   AMBTM
02046A F9DF D6 5F     A        LDAB   AMBTM+1
02047A F9E1 CE C800   A        LDX    #$C800   MULT TEMP BY .735
02048A F9E4 BD F284   A        JSR    MULT
02049A F9E7 8D 27 FA10         BSR    SETPT
02050A F9E9 CE 02B3   A        LDX    #$2B3    EQUAL TO DIV. BY .37
02051A F9EC 20 34 FA22         BRA    GUDVAL
02052A F9EE 96 5E     A TELECN LDAA   AMBTM
02053A F9F0 D6 5F     A        LDAB   AMBTM+1
02054A F9F2 CE 8800   A        LDX    #$8800   MULT BY .53
02055A F9F5 BD F284   A        JSR    MULT
02056A F9F8 8D 16 FA10         BSR    SETPT
02057A F9FA CE 020A   A        LDX    #$20A    EQUIV. TO DIV. BY .4904
02058A F9FD 20 23 FA22         BRA    GUDVAL
02059A F9FF 96 5E     A TELECI LDAA   AMBTM
02060A FA01 D6 5F     A        LDAB   AMBTM+1
02061A FA03 CE A400   A        LDX    #$A400   MULT BY .6406
02062A FA06 BD F284   A        JSR    MULT
02063A FA09 8D 05 FA10         BSR    SETPT
02064A FA0B CE 0246   A        LDX    #$246
02065A FA0E 20 12 FA22         BRA    GUDVAL
02066A FA10 EE 01     A SETPT  LDX    1,X      GET TEMP IN X REG
02067A FA12 DF 60     A        STX    NEWTMP   AND STORE IT
02068A FA14 5F                 CLRB            SUBTRACT NEWTMP FROM POSTTM
02069A FA15 96 5D     A        LDAA   POSTTM+1
02070A FA17 D0 61     A        SUBB   NEWTMP+1
02071A FA19 92 60     A        SBCA   NEWTMP
02072A FA1B 2A 04 FA21         BPL    OKSIGN   BR IF POS.
02073A FA1D 50                 NEGB
02074A FA1E 89 00     A        ADCA   #0
02075A FA20 40                 NEGA
02076             FA21 A OKSIGN EQU   *
02077A FA21 39                 RTS
```

```
02078A FA22 BD F284  A GUDVAL JSR    MULT
02079A FA25 17                TBA            A=B
02080A FA26 E6 02    A        LDAB   2,X
02081A FA28 36                PSHA
02082A FA29 37                PSHB
02083A FA2A D6 88    A        LDAB   PIA3AD
02084A FA2C C5 08    A        BITB   #$8
02085A FA2E 27 20 FA50        BEQ    ALDNE
02086A FA30 CE 01F4  A        LDX    #500
02087A FA33 DF 1E    A        STX    SPDPER
02088A FA35 16                TAB
02089A FA36 4F                CLRA
02090A FA37 CE 0044  A        LDX    #DISREG
02091A FA3A BD F4F1  A        JSR    HEXBCD
02092A FA3D 86 00    A        LDAA   #$0
02093A FA3F 97 06    A        STAA   DECPT
02094A FA41 CE 0044  A LP1    LDX    #DISREG
02095A FA44 BD F74D  A        JSR    DISPLA
02096A FA47 DE 1E    A        LDX    SPDPER
02097A FA49 09                DEX
02098A FA4A 27 04 FA50        BEQ    ALDNE
02099A FA4C DF 1E    A        STX    SPDPER
02100A FA4E 20 F1 FA41        BRA    LP1
02101A FA50 33         ALDNE  PULB
02102A FA51 32                PULA
02103A FA52 80 50    A OKSGN  SUBA   #80
02104A FA54 2A 0C FA62        BPL    OKNOW   SEE IF PLUS
02105A FA56 37                PSHB
02106A FA57 C6 FF    A        LDAB   #$FF    SET NEG BIT
02107A FA59 D7 64    A        STAB   SETNEG
02108A FA5B 33                PULB
02109A FA5C 50                NEGB
02110A FA5D 89 00    A        ADCA   #0
02111A FA5F 40                NEGA
02112A FA60 20 03 FA65        BRA    OKNOW1
02113A FA62 7F 0064  A OKNOW  CLR    SETNEG
02114A FA65 CE 1400  A OKNOW1 LDX    #$1400
02115A FA68 BD F284  A        JSR    MULT
02116A FA6B 7D 0064  A DUN    TST    SETNEG
02117A FA6E 2A 04 FA74        BPL    ALLDUN
02118A FA70 50                NEGB
02119A FA71 89 00    A        ADCA   #0
02120A FA73 40                NEGA
02121A FA74 97 54    A ALLDUN STAA   RESULT
02122A FA76 D7 55    A        STAB   RESULT+1
02123A FA78 DE 54    A        LDX    RESULT
02124A FA7A 39                RTS
02125                       *
02126                       *
02127                       *
02128                       *
02129         FA7B   A INIT   EQU    *
02130A FA7B D6 0F    A        LDAB   DATAH+1  POST TEMP LSB
02131A FA7D 96 0E    A        LDAA   DATAH    MSB
02132A FA7F 2A 04 FA85        BPL    SIGNOK   BR. IF TEMP ABOVE 80 DEG.
02133A FA81 50                NEGB            NORMALIZE TEMP
02134A FA82 89 00    A        ADCA   #0
02135A FA84 40                NEGA
02136A FA85 97 4E    A SIGNOK STAA   DIVEND+1 00XX.XX00
02137A FA87 D7 4F    A        STAB   DIVEND+2
02138A FA89 5F                CLRB
02139A FA8A D7 51    A        STAB   DIVEND+4
02140A FA8C D7 50    A        STAB   DIVEND+3
02141A FA8E CE 004D  A        LDX    #DIVEND
02142A FA91 86 14    A        LDAA   #20      MV/20+80=POST TEMP
02143A FA93 BD F2AD  A        JSR    DIVIDE
02144A FA96 5F                CLRB            ADD 80 DEG
02145A FA97 86 50    A        LDAA   #80
02146A FA99 7D 000E  A        TST    DATAH    SEE IF ABOVE OR BELOW 80 DEG
02147A FA9C 2A 0A FAA8        BPL    PLUSD    BR IF ABOVE
02148A FA9E D0 55    A        SUBB   RESULT+1
02149A FAA0 92 54    A        SBCA   RESULT
02150A FAA2 5D         TSTRND TSTB
02151A FAA3 2B 0B FAB0        BMI    NORND
02152A FAA5 4A                DECA
02153A FAA6 20 08 FAB0        BRA    NORND
02154         FAA8   A PLUSD  EQU    *
02155A FAA8 DB 55    A        ADDB   RESULT+1
02156A FAAA 99 54    A        ADCA   RESULT
02157A FAAC 5D                TSTB
02158A FAAD 2A 01 FAB0        BPL    NORND
02159A FAAF 4C                INCA
02160A FAB0 97 55    A NORND  STAA   RESULT+1
```

```
02161A FAB2 4F                    CLRA
02162A FAB3 97 54    A            STAA    RESULT
02163A FAB5 DE 54    A            LDX     RESULT
02164A FAB7 39                    RTS
02165                             NAM
02166                             TTL     GLOBE UNION BATTERY TESTER
02167                *
02168                * INTERRUPT VECTORS
02169                *
02170A FFF8                       ORG     $FFF8
02171                *
02172A FFF8 F6C0     A            FDB     BGINT    INTERRUPT REQUEST VECTOR
02173A FFFA F000     A            FDB     RESTAR   NOT USED (SWI)
02174A FFFC F000     A            FDB     RESTAR   NOT USED (NMI)
02175A FFFE F000     A            FDB     RESTAR   RESTART VECTOR
02176                             END
TOTAL ERRORS 00000
```

GLOBE UNION BATTERY TESTER

```
ACDISP F617  ACDONE F628  ACKTST F5FE  ACNODS 0021  ADDIT  F815  ADIRQ  0034  ALDNE  FA50  ALLDUN FA74
ALTEST F393  ALTOUT 003C  AMBMV  005A  AMBTM  005E  ATOD   F6A7  ATODD  0002  ATODN  0001  BACK   F775
BACKO  F772  BADBAT F087  BADDOD F98A  BADSPD F4D9  BATBBN F1CA  BATCLR F08A  BATCON F1D4  BATCTR 002D
BATEST F049  BATLSB F1A7  BATLUP F108  BATVA  0026  BATVL  0022  BATVTC 0024  BATXX  F14B  BCDCTR 004C
BCDLOP F82B  BCDNEG 000D  BCDNOW F081  BCDTOH F81D  BCNSTR 002E  BEZAB  F139  BGINT  F6C0  BLINK  F09C
BRDBAT F055  BRLDOK F140  BSTART F04C  BSYTST F63C  BTDISP F115  BTDONE F15A  BTGOOD F150  BTLTOF F155
BTMCLR F06F  BTPNEG F064  BUSY1  F648  CALFF  F9B5  CCSH   0028  CHARLI F153  CHKMOR F9DB  CLRGST F06C
CONLP1 F21B  CONLP2 F255  CONLP3 F24C  CONTST F12A  CONTUE F501  CTLCLR F70F  CTR    0048
CTUF   F67F  DATAH  000E  DECLOP F50E  DECPT  0006  DECTAB F539  DISBTV F163  DISBVO F16F  DISCTL 0033
DISPA  F619  DISPLA F74D  DISREG 0044  DIVO   F2C8  DIV1   F2E1  DIVEND 004D  DIVIDE F2AD  DIVSOR 0052
DLYST  F0BE  DLYTIM 0056  DONE   F8A2  DRLOOP F11E  DRNLOP F17A  DRNLP1 F196  DRNTST F5D1  DRWLMP F564
DRWON  F323  DSPLTB F7BF  DUN    FA6B  EBBTMP F8B9  EBLOOP F1BD  EBTLOP F8C5  EBTMPH 0015  ERFTMP F862
ETMPH  0013  FAIL   F72C  FAIL1  F73A  FAILNT F730  FALLOP F741  FLHLHT F98B  FLHVFA F9AB  FLHVFT F998
FLSH   F97D  FLSHM1 F450  FLSHUM F447  FRAILG F41E  FSHFST 0065  GOSHOW F692  GOTHRU F778  GRECRG F23B
GUDVAL FA22  HEXBCD F4F1  HOP    F2DA  INIT   FA7B  IRQRET F6FB  IXH    0007  IXH1   0049  KFLASH 0057
LAMPS  F7C9  LAMPSO F1D1  LAMPS1 F379  LAMPS3 F630  LDPIAS F786  LINDEL 0000  LINEO  F5E2
LINE01 F5E5  LINE1  F5F0  LINE2  F5F2  LJUST  F2C4  LMPCOL 0009  LMPROW 000A  LMPSOF F658  LMPST1 000B
LMPST2 000C  LP1    FA41  LPONOF F23E  LSBMIN F768  LSBTST F0B7  LWVLTS F354  MMM    F655  MORE   F87D
MOVLOP F705  MULCND 004E  MULLP  F297  MULPYR 0050  MULT   F284  NBUSY2 F18E  NCTH   0011  NCTL   0012
NEWTMP 0060  NEXT   F7A6  NNN    F635  NODEC  F7B7  NODIS1 F12D  NORND  FAB0  NOSAME F7E0  NOSYNC F6D9
NOTDIG F7BB  NOTFST F6D8  NXTBCD F50A  NXTDIG F7AF  OK1500 F3C0  OKNOW  FA62  OKNOW1 FA65  OKSGN  FA52
OKSIGN FA21  ONLINE F633  ORASR  F712  PBTBL  F697  PBUT   F660  PBUT1  F662  PCLEAR F65D  PIA1AC 0081
PIA1AD 0080  PIA1BC 0083  PIA1BD 0082  PIA2AC 0085  PIA2AD 0084  PIA2BC 0087  PIA2BD 0086  PIA3AC 0089
PIA3AD 0088  PIA3BC 008B  PIA3BD 008A  PIASTO 002C  PLUS   F84C  PLUSD  FAA8  PLXIT  F81A  POSHEX F4FF
POSTMV 0058  POSTTM 005C  POSY   F723  QUIT   F8AA  RACUM  F5B2  RAGAIN F585  RCHK   F5AF  RDBATV F468
RDMORE F6E1  RDSALT F55F  RDSPLA F56A  RDSREG F58A  RDSSDR F55B  RDTEMP F07B  RDVIDE F3C7  REDAMB F76C
REGCTR 0032  RELAY  F8D5  RELAY1 F423  RELKA  0037  RELNUM 0036  RESTAR F000  RESULT 0054  RET1   F077
RETAGN F7A5  RETEST F043  RETURN F6BF  RFLASH F398  RIPPLE F964  RIPSTA 0020  RNEXT  F54B  ROLCNT 0035
ROLDSP F541  ROUT   F59E  RPBUT  F56D  RPLOK  F3B4  RRELAY F3DD  RSBRCT F3C3  RSHIFT F3CA  RSPEE1 F3A0
RSPEED F3B7  SAMEA  F800  SCGT1  F66B  SETNEG 0064  SETPT  FA10  SHIFT  F29D  SHIFTL F2BD  SIGNOK FA85
SKIP   F892  SLPZ   F881  SPD15H F4CB  SPD20H F4DB  SPDCHK F972  SPDFLP 001C  SPDLOW F95F  SPDONE 0019
SPDPER 001E  SPDRED F933  SPDST  F91D  SPDSTO 001B  SPDTRU 001D  SPDXX  F93B  SPDZRO 001A  SPEED  F8F0
SSENS  F8FF  SSGO   F94E  SSKIP  F94A  STACK1 0010  STDATA F6EE  STILOK F27E  STOVER F0BB  STRDRW 0038
STRLOP F362  STRT   F87B  STTMP  F0DB  TELEC1 F9FF  TELECN F9EE  TELECY F9DD  TEMPER 004B  TEMPHX 0017
TMPAGN F0C2  TMPTBL F853  TNSFRB F7F1  TOMUCH F519  TOOBIG F2F9  TSTDOD F9B1  TSTOFF F41B  TSTRND FAA2
TSTVL  F62B  TURNON F7EF  VALUE  0062  VCTR10 002A  VEHCTR 002F  VEHDVD 0030  VEHTST F30A  VERD5O F2FC
VFLASH F315  VHF15S F33C  VHFSEC F32C  VLTEST F46D  VLTREG 0040  VLVJMP F359  VOLTST F5C1  VRGLOP F4B5
VSPD2  F496  VSPEED F47F  WAIT1  F8E9  WAIT2  F6BB  WAITFO F8E7  WATQTR F4EB  XFIELD 0031  XFLTST F37C
XFRDI  F3EB  XQUIT  F426  XSPEED F430  XX1    F575
```

15/977 20/240

It will thus be seen that there have been provided circuitry for completely automatically detecting the presence of a single defective cell in a multi-cell storage battery as well as a fully automatic battery analyzing apparatus which makes use of such a bad cell detecting circuit. The disclosed circuitry is effective to detect the presence of significant increases in the battery terminal voltage while the battery is subjected to a relatively constant load; it is most effective in detecting the presence of electrical shorts around or through the cell separators, the presence of unintended connections between adjacent battery straps, adjacent battery plates, or between a battery strap and plate, and is effective but to a lesser degree in detection the loss of electrical continuity or mechanical connection between the battery plates and straps, the presence of a broken strap, and the exisence of positive plate "polarization" in one of the battery cells. The combination of such circuitry with apparatus for performing a battery load test and a bounce back voltage test results in a battery analyzer which is more reliable than those available in the prior art and which gives a correct indication of the acceptability of the battery under test without the necessity of recharging and retesting the battery with more frequency than those available in the prior art.

In the particular embodiment disclosed, in order to detect the presence of a bad cell, the battery terminal voltage was analyzed to determine whether it increased by more than 0.17 volts in any time interval during the periods of 5 to 20 seconds following the application of a 0.1 ohm resistive load to the battery. The analysis may alternately be viewed as a determination of whether the rate average of change of the battery terminal voltage exceeded 0.017 volts/second at any time during the 5 to 15 second period or 0.011 volts/second at any time during the 5 to 20 second period. If different loads were used, correspondingly different voltage changes and/or rates of change might also be used. Further, many other techniques may be used for determining whether the time rate of change of the battery terminal voltage exceeds a predetermined value.

Figure 8:
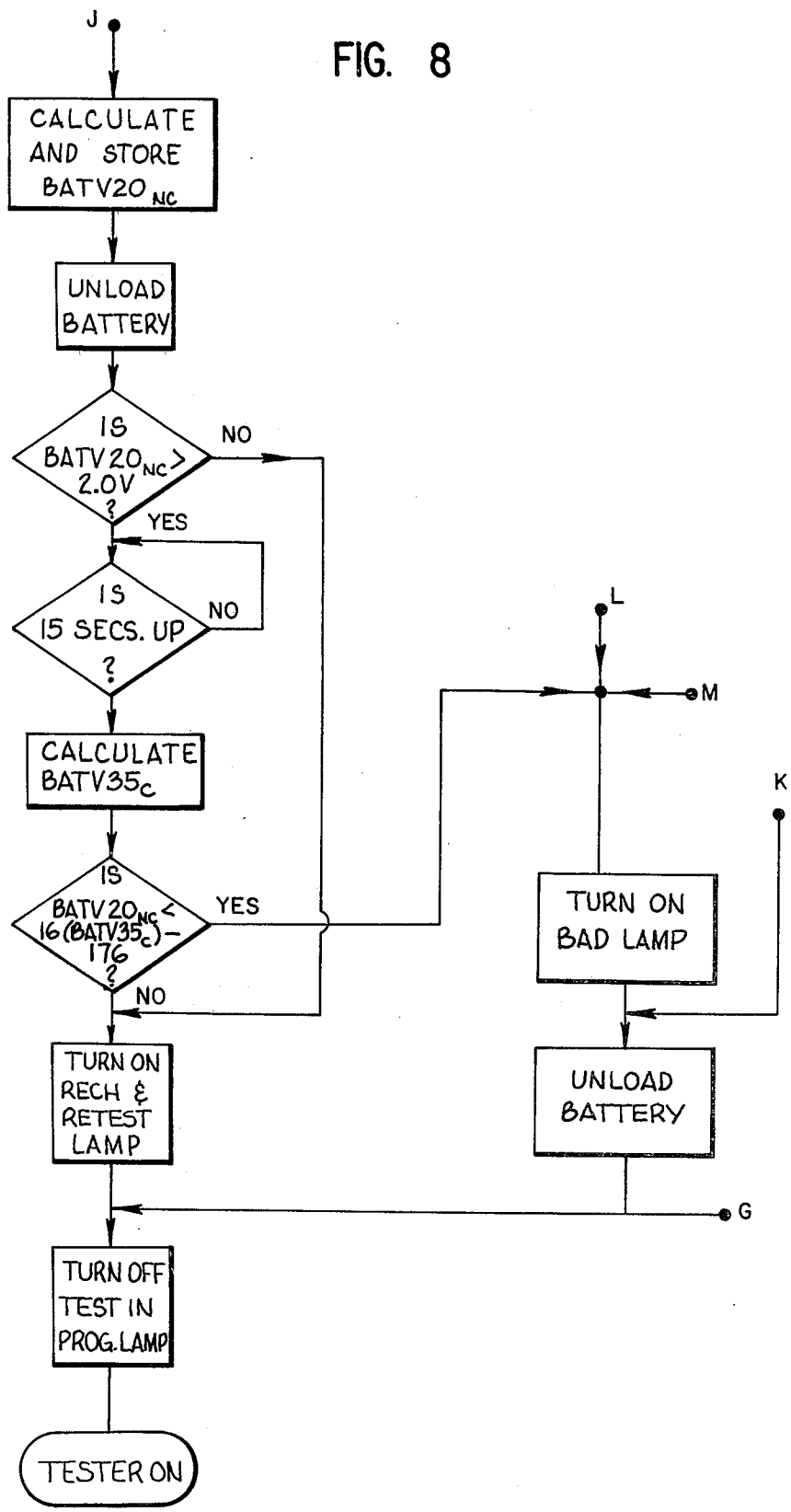
FIGS. 8 and 9 are flow diagrams of alternate embodiments of this invention.
Figure 9:
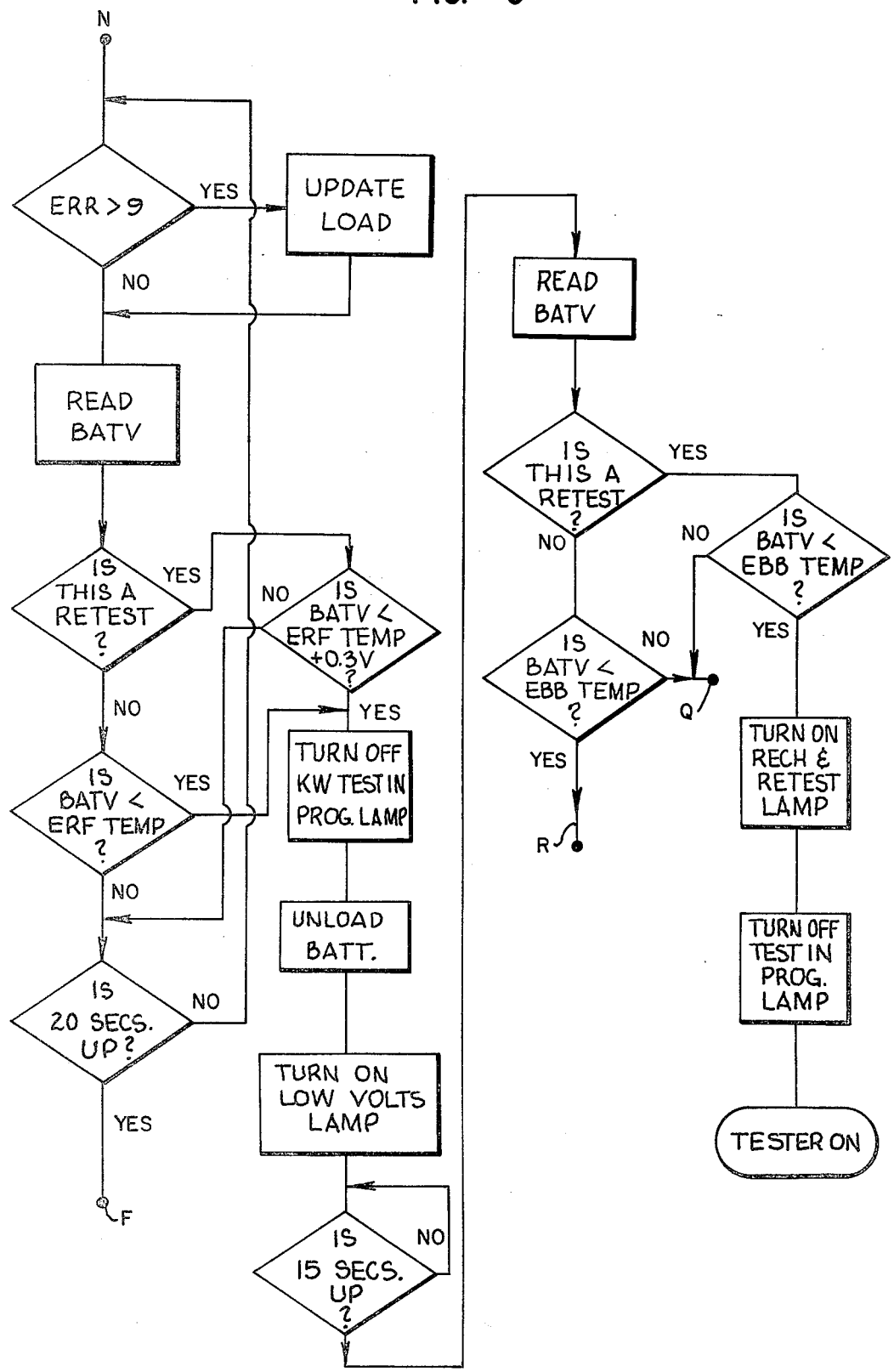

Flow charges disclosing the operation of alternative embodiments to the automatic battery analyzer of FIGS. 3-7 are shown in FIGS. 8 and 9. Each of FIGS. 8 and 9 are flow charts of the operation of only a portion of the battery analyzer and are intended to be read in conjunction with FIGS. 7a-7e to disclose the operation of the complete apparatus. The flow chart of FIG. 8 is intended to be substituted for the material within the dashed box 550 of FIG. 7e to disclose a first alternative embodiment of this invention and the flow chart for FIG. 9 is similarly intended to be substituted for the material within the dashed box 552 of FIGS. 7c and 7d to disclose a second alternative embodiment. In each case, the lines designated by letters in the FIG. 7 drawings are intended to join the similarly designated lines of FIGS. 8 and 9.

In the FIG. 8 embodiment, at the conclusion of the five second period of loop 526 rather than ascertaining that insufficient information is available to determine the condition of the battery and indicating that the battery must be recharged and retested, apparatus is provided for performing two further tests on the battery. Each of the two additional tests involve measuring the battery terminal voltage at 20 seconds following the application of the fixed resistance load across its terminals, correcting that measured voltage to compensate for the temperature of the battery under test, and normalizing that measured value to the terminal voltage which would be generated by a battery having a cold cranking rating of 500 amperes being in a condition smaller to that of the battery under test. That correction and normalization is carried out to arrive at a value of $BATV20_{NC}$ as follows:

$$BATV20_{NC} = BATV20 \times \left( \frac{1}{ERFTEMP \times [0.08488 + (0.1268 \times CCR)]} \right)$$

CCR = Cold cranking rating of battery under test.

Following determination of $BATV20_{NC}$, the load is removed from the battery and, as the first test, a determination is made of whether $BATV20_{NC}$ is less than 2.0 volts. If so, the lamp indicating that the battery should be recharged and retested is illuminated; this test is included because it is known that in some cases badly discharged but otherwise acceptable calcium and strontium lead storage batteries will have an abnormally low value for $BATV20_{NC}$.

The second test of FIG. 8 is performed if the first test does not indicate that the battery should be recharged and retested and comprises a comparison between $BATV20_{NC}$ and the battery terminal voltage at the time 15 seconds after the fixed resistance load is removed from battery, i.e., 35 seconds after that load was applied to the battery. A 15 second delay is first executed and the battery terminal voltage is then measured and corrected for the temperature of the battery under test to arrive at a value for $BATV35_C$ as follows:

$$BATV35_C = BATV35 \times [1 + 0.00051(80 - T_E)]$$

$T_E$ = battery temperature in °F.

The value of $BATV20_{NC}$ is then compared with $BATV35_C$ according to the following inequality:

$$BATV20_{NC} 16 (BATV35_C) - 176$$

If the inequality is satisfied, the battery is assumed to be unacceptable. It has been observed that batteries which are either severely discharged or have a single defective cell may both have low values of approximately eleven volts for $BATV35_C$, but among batteries with such low values of $BATV35_C$, those having a defective cell will tend to have higher values for $BATV20_{NC}$. This second test is intended to take this observation into account.

In the embodiment of FIG. 9 the procedure for testing the battery after it has been recharged is modified from that shown in FIG. 7 in two specific manners as disclosed in that FIG. 9. First, if the battery is being retested, the value of terminal voltage required at the end of the load test for the battery to be determined acceptable is increased over that used in the FIG. 7 embodiment by approximately 0.2-0.3 volts. Second, the voltage bounce back test is performed when the battery is retested. If the battery terminal voltage at the end of 15 seconds following the termination of the load test exceeds the calcualted value of EBBTEMP, the battery is assumed to be unacceptable and the lamp so indicating is illuminated. If, however, the battery terminal voltage at the same time is less than EBBTEMP, it is known that the battery was not in fact fully charged with the retest procedure was commenced, and that it should be fully recharged and retested. The lamp so indicating is then illuminated. The purpose at this procedure is to ascertain the existence of batteries being retested which were thought to be fully recharged but were not. A particular instance where this might occur is where strontium or calcium storage batteries are placed in parallel on the same charger with antimony batteries.

While particular embodiments of this invention have been described, it will be understood, of course, that the invention is not to be limited thereto since modifications may be made by those skilled in the art, particularly in light of the foregoing teachings. As an example, and in addition to the modifications previously discussed, in the disclosed embodiment the circuitry for performing the bad cell detector test analyzes the battery terminal voltage when a constant resistance load is placed across the battery; in the battery analyzer described, this means that the battery is subject to relatively high current drains during two separate occasions, during the load test and during the bad cell detection test. It might be found desirable to perform a test equivalent to the disclosed bad cell detection test but using a variable load instead of an essentially fixed load; this possibility might be found especially attractive in embodiments using a microprocessor such as the embodiment here disclosed as the appropriate program could be provided with the microprocessor would make any necessary calculations, conversions, or corrections so that even though a variable resistance load was in use, the test performed would be fully equivalent to that performed by the bad cell detector circuitry disclosed herein. In some instances it may even be found desirable to perform the bad cell detector test at the same time the load test is being executed. Further, while in the disclosed embodiment a 0.1 ohm load is applied to the battery for fixed time periods of fifteen seconds and five seconds, different loads and different time periods could be used. Likewise, while in the disclosed embodiment a rise in the battery terminal voltage while under load of more than 0.17 volts was considered to be indicative of a defective cell, it might be found desirable in the future to use a different voltage change for the criterion. Further, it might be found desirable to add to the battery analyzer disclosed herein the internal resistance test referred to in the aforementioned application Ser. No. 863,925.

It is contemplated by the appended claims to cover any such modifications as fall within the time spirit and scope of this invention.

We claim:

1. Apparatus for determining the acceptability of a storage battery under test and comprising:
    first circuit means for coupling to the battery under test and performing a load test on said battery;
    second circuit means for coupling to the battery under test and performing a voltage bounce back test on said battery;
    third circuit means for coupling to the battery under test, placing a load on said battery, and testing whether the rate of change of the battery voltage exceeds a predetermined value; and
    fourth circuit means coupled to said first, second, and third circuit means for controlling the sequence in which the tests of said first, second, and third circuit means are performed and providing a readout responsive to outputs of said first, second, and third circuit means.

2. The apparatus of claim 1 wherein said fourth circuit means further provides that said load test is the first of said tests to be performed on the battery under test, said voltage bounce back test is the second of said tests to be performed on the battery under test, and said battery voltage rate of change test is the third of said tests to be performed on the battery under test.

3. The apparatus of claim 2 wherein said fourth circuit means further provides a readout that the battery under test is acceptable if said load test is passed.

4. The apparatus of claim 3 wherein said fourth circuit means further prevents the occurrence of said voltage bounce back test and said battery voltage rate of change test if said load test is passed.

5. The apparatus of claim 3 wherein said fourth circuit means provides a readout that the battery under test is unacceptable if said voltage bounce back test is passed.

6. The apparatus of claim 5 wherein said fourth circuit means further prevents the occurrence of said battery voltage rate of change test if said voltage bounce back test is passed.

7. The apparatus of claim 6 wherein said fourth circuit means further provides a readout that the battery under test should be recharged and retested if said battery voltage rate of change does not exceed said predetermined value.

8. The apparatus of claim 7 wherein said fourth circuit means further provides a readout that the battery under test is unacceptable if said battery voltage rate of change exceeds said predetermined value.

9. The apparatus of claim 8 wherein said third circuit means further determines whether the battery voltage is less than a predetermined value at the end of a time period following the placing of said load on said battery.

10. The apparatus of claim 9 wherein said fourth circuit means further provides a readout that the battery under test is acceptable but should be recharged if the battery voltage exceeds said predetermined value at the end of said time period.

11. The apparatus of claim 1 wherein said third circuit means further determines whether the battery terminal voltage exceeds a second predetermined value at the end of a time period following the placing of said load on said battery.

12. The apparatus of claim 11 wherein said fourth circuit means further provides that the test performed by said first circuit means is the first of said tests to be performed on the battery under test, the test performed by said second circuit means is the second of said tests to be performed on the battery under test, and the tests performed by said third circuit means are the last of said tests to be performed on the battery under test.

13. The apparatus of claim 12 wherein said fourth circuit means further provides a readout that the battery under test should be recharged and retested if said battery terminal voltage exceeds said second predetermined value at the end of said time period.

14. The apparatus of claim 13 wherein said fourth circuit means further provides a readout that the battery under test is unacceptable if said battery terminal voltage is less than said second predetermined value at the end of said time period.

15. The apparatus of claim 1 wherein said third circuit means further determines whether the battery terminal voltage at the end of a first time period following the placing of said load on said battery and the battery terminal voltage at the end of a second time period following the removal of said load from said battery fulfill a predetermined relationship.

16. The apparatus of claim 15 wherein said fourth circuit means further provides that the test performed by said first circuit means is the first of said tests to be performed on the battery under test, the test performed by said second circuit means is the second of said tests to be performed on the battery under test, and the tests performed by said third circuit means are the last of said tests to be performed on the battery under test.

17. The apparatus of claim 16 wherein said fourth circuit means further provides readouts that either the battery under test is unacceptable or should be recharged and retested dependent upon whether said predetermined relationship is fulfilled.

18. The apparatus of claim 1 further including fifth circuit means for indicating that the battery under test is thought to be fully charged and said fourth circuit means further provides that only the tests of said first and second circuit means are performed when the battery under test is thought to be fully charged.

19. The apparatus of claim 18 wherein said fourth circuit means further provides that said load test is the first of said tests to be performed on the battery under test and said voltage bounce back test is the last of said tests to be performed on the battery under test when the battery under test is thought to be fully charged and provides a readout that the battery under test is acceptable if said load test is passed, that the battery under test is unacceptable if said load test is failed, and said voltage bounce back test is passed, and that the battery under test should again be recharged and retested if said load test is failed and said voltage bounce back test is failed.

20. The method of determining the acceptability of an electrical storage battery comprising:
    the first step of performing an electrical load test on said battery;
    the second step of performing a voltage bounce back test on said battery;

the third step of performing a test responsive to the rate of change of the battery voltage while the battery is under a load; and the fourth step of determining from the results of said first, second, and third steps the acceptability of said battery.

21. The method of determining the acceptability of an electrical storage battery comprising:

the first step of placing a load on said battery, determining whether the battery terminal voltage is above a first predetermined level after a first predetermined period of time, and removing said load from said battery;

the second step of determining whether the battery terminal voltage is above a second predetermined level after a second predetermined period of time following the removal of said load from said battery;

the third step of determining whether the rate of change of the battery voltage while the battery is under load is above a third predetermined value; and the fourth step of determining from the results of said first, second, and third steps whether said battery is acceptable.

22. The method of claim 21 wherein said first, second, and third steps are performed in the order recited.

23. The method of claim 22 wherein said fourth step further comprises the steps of:

generating an indication that the battery under test is acceptable when the battery terminal voltage is above said first predetermined level after said first period of time;

generating an indication that the battery under test is unacceptable when the battery terminal voltage is below said first predetermined level after said first period of time and above said second predetermined level after said second period of time; and generating an indication that the battery under test is either unacceptable or should be recharged and retested in response to the results of said third step when the battery terminal voltage is below said first predetermined level after said first period of time and below said second predetermined level after said second period of time.

24. The method of claim 23 wherein said last recited step further generates an indication that the battery under test is unacceptable if the change of the battery voltage while the battery is under load is above said third predetermined value and generates an indication that the battery under test should be recharged and retested if the rate of change of the battery voltage while the battery is under load is below said third predetermined value.

25. The method of claim 23 further comprising the step of determining whether the open circuit terminal voltage of said battery is below a fourth predetermined value prior to said first step and generating an indication that the battery under test is unacceptable if said open circuit terminal voltage is below said fourth predetermined value.

26. Apparatus for determining the acceptability of a storage battery under test and comprising:

first circuit means for coupling to the battery under test and performing a load test on said battery;

second circuit means for coupling to the battery under test and performing a voltage bounce back test on said battery;

third circuit means for coupling to the battery under test, placing a load on said battery, and testing whether the battery voltage increase is greater than a predetermined amount during a time period; and fourth circuit means coupled to said first, second, and third circuit means for controlling the sequence in which the tests of said first, second, and third circuit means are performed and providing a readout responsive to outputs of said first, second, and third circuit means.

27. The apparatus of claim 26 wherein said fourth circuit means further provides that the test performed by said first circuit means is the first of said tests to be performed on the battery under test, the test performed by said second circuit means is the second of said tests to be performed on the battery under test, and the test performed by said third circuit means is the third of said tests to be performed on the battery under test.

28. The apparatus of claim 27 wherein said fourth circuit means further provides a readout that the battery under test is acceptable if said load test is passed.

29. The apparatus of claim 28 wherein said fourth circuit means further prevents the occurrence of said voltage bounce back test and the test performed by said third circuit means if said load test is passed.

30. The apparatus of claim 29 wherein said fourth circuit means provides a readout that the battery under test is unacceptable if said voltage bounce back test is passed.

31. The apparatus of claim 30 wherein said fourth circuit means further prevents the occurrence of the test performed by said third circuit means if said voltage bounce back test is passed.

32. The apparatus of claim 31 wherein said fourth circuit means further provides a readout that the battery under test should be recharged and retested if said battery voltage increases less than said predetermined amount during said time period.

33. The apparatus of claim 32 wherein said fourth circuit means further provides a readout that the battery under test is unacceptable if said battery voltage increases more than said predetermined amount during said time period.

34. The apparatus of claim 33 wherein said third circuit means further determines whether the battery voltage is less than a predetermined value at the end of a time period following the placing of said load on said battery.

35. The apparatus of claim 34 wherein said fourth circuit means further provides a readout that the battery under test is acceptable but should be recharged if the battery voltage exceeds said predetermined value at the end of said time period following the placing of said load on said battery.

36. The apparatus of claim 35 wherein said third circuit means further determines whether the battery terminal voltage exceeds a predetermined value at the end of a time period following the placing of said load on said battery.

37. The apparatus of claim 36 wherein said fourth circuit means further provides that the test performed by said first circuit means is the first of said tests to be performed on the battery under test, the test performed by said second circuit means is the second of said tests to be performed on the battery under test, and the tests performed by said third circuit means are the last of said tests to be performed on the battery under test.

38. The apparatus of claim 37 wherein said fourth circuit means further provides a readout that the battery under test should be recharged and retested if said battery terminal voltage exceeds said predetermined value at the end of said time period.

39. The apparatus of claim 38 wherein said fourth circuit means further provides a readout that the battery under test is unacceptable if said battery terminal voltage is less than said predetermined value at the end of said time period.

40. The apparatus of claim 26 wherein said third circuit means further determines whether the battery terminal voltage at the end of a first time period following the placing of said load on said battery and the battery terminal voltage at the end of a second time period following the removal of said load from said battery fulfill a predetermined relationship.

41. The apparatus of claim 40 wherein said fourth circuit means further provides that the test performed by said first circuit means is the first of said tests to be performed on the battery under test, the test performed by said second circuit means is the second of said tests to be performed on the battery under test, and the tests performed by said third circuit means are the last of said tests to be performed on the battery under test.

42. The apparatus of claim 41 wherein said fourth circuit means further provides readouts that either the battery under test is unacceptable or should be recharged and retested dependent upon whether said predetermined relationship is fulfilled.

43. The apparatus of claim 26 further including fifth circuit means for indicating that the battery under test is thought to be fully charged and said fourth circuit means further provides that only the tests of said first and second circuit means are performed when the battery under test is thought to be fully charged.

44. The apparatus of claim 43 wherein said fourth circuit means further provides that said load test is the first of said tests to be performed on the battery under test and said voltage bounce back test is the last of said tests to be performed on the battery under test when the battery under test is thought to be fully charged and provides a readout that the battery under test is acceptable if said load test is passed, that the battery under test is unacceptable if said load is failed test and said voltage bounce back test is passed, and that the battery under test should again be recharged and retested if said load test is failed and said voltage bounce back test is failed.

45. The method of determining the acceptability of an electrical storage battery comprising:
the first step of performing an electrical load test on said battery;
the second step of performing a voltage bounce back test on said battery;
the third step of performing a test responsive to whether the battery voltage increases greater than a predetermined amount during a time period while the battery is under a load; and
the fourth step of determining from the results of said first, second, and third steps the acceptability of said battery.

46. The method of determining the acceptability of an electrical storage battery comprising:
the first step of placing a load on said battery, determining whether the battery terminal voltage is above a first predetermined level after a first predetermined period of time, and removing said load from said battery;
the second step of determining whether the battery terminal voltage is above a second predetermined level after a second predetermined period of time following the removal of said load from said battery;
the third step of determining whether the rate of change of the battery voltage increases greater than a predetermined amount during a time period while the battery is under load; and
the fourth step of determining from the results of said first, second, and third steps whether said battery is acceptable.

47. The method of claim 46 wherein said first, second, and third steps are performed in the order recited.

48. The method of claim 47 wherein said fourth step further comprises the steps of:
generating an indication that the battery under test is acceptable when the battery terminal voltage is above said first predetermined level after said first period of time;
generating an indication that the battery under test is unacceptable when the battery terminal voltage is below said first predetermined level after said first period of time and above said second predetermined level after said second period of time; and
generating an indication that the battery under test is either unacceptable or should be recharged and retested in response to the results of said third step when the battery terminal voltage is below said first predetermined level after said first period of time and below said second predetermined level after said second period of time.

49. The method of claim 48 wherein said last recited step further generates an indication that the battery under test is unacceptable if the increase in the battery voltage while the battery is under load is above said predetermined amount and generates an indication that the battery under test should be recharged and retested if the increase in the battery voltage while the battery is under load is below said predetermined amount.

50. The method of claim 48 further comprising the step of determining whether the open circuit terminal voltage of said battery is below a third predetermined value prior to said first step and generating an indication that the battery under test is unacceptable if said open circuit terminal voltage is below said third predetermined value.

* * * * *

UNITED STATES PATENT AND TRADEMARK OFFICE
CERTIFICATE OF CORRECTION

PATENT NO. : 4,322,685

DATED : March 30, 1982

INVENTOR(S) : Charles E. Frailing, Thomas J. Dougherty, and Richard T. Johnson

It is certified that error appears in the above-identified patent and that said Letters Patent is hereby corrected as shown below:

Col. 1, line 51, "can" should be -- came --

Col. 3, line 1, "fail" should be -- fall --

Col. 5, line 34, "at" should be -- in --

Col. 6, line 43, after 310 insert -- , --

Col. 6, line 57, "the" should be -- that --

Col. 9, line 68, delete "attorney's" and "date"

Col. 10, line 4, "for" should be -- of --

Col. 11, line 45, "if" should be -- If --

Col. 12, line 17, "to" should be -- is --

Col. 47, line 46, delete "15/977 20/240"

Col. 49, line 12, "for" should be -- of --

Col. 50, line 25, "the" should be -- that --

Col. 50, line 55, "with" should be -- by which --

Col. 54, line 27, (Claim 30) "29" should be -- 28 --

Col. 54, line 56 (Claim 36) "35" should be -- 26 --

Signed and Sealed this

Ninth Day of August 1983

[SEAL]

Attest:

GERALD J. MOSSINGHOFF

Attesting Officer

Commissioner of Patents and Trademarks